United States Patent [19]
Bertin et al.

[11] Patent Number: 5,414,637
[45] Date of Patent: May 9, 1995

[54] INTRA-MODULE SPARE ROUTING FOR HIGH DENSITY ELECTRONIC PACKAGES

[75] Inventors: Claude L. Bertin, Burlington; Christopher P. Miller, Underhill, both of Vt.; David J. Perlman, Wappingers Falls, N.Y.

[73] Assignee: International Business Machines Corporation, Armonk, N.Y.

[21] Appl. No.: 903,681

[22] Filed: Jun. 24, 1992

[51] Int. Cl.6 .............................................. H05K 7/00
[52] U.S. Cl. .................... 364/489; 364/490; 364/491; 437/7
[58] Field of Search ............... 364/488, 489, 490, 491; 361/396, 414, 388, 389; 29/593; 437/208, 915, 7; 357/74, 75; 371/8.1, 11.1, 10.3, 9.1

[56] References Cited

U.S. PATENT DOCUMENTS

| | | | |
|---|---|---|---|
| 4,792,955 | 12/1988 | Johnson et al. | 371/68 |
| 4,803,595 | 2/1989 | Kraus et al. | 361/412 |
| 4,849,657 | 7/1989 | Boisvert | 307/441 |
| 4,974,048 | 11/1990 | Chakravorty | 357/40 |
| 4,983,533 | 1/1991 | Go | 437/7 |
| 5,019,946 | 5/1991 | Eichelberger | 361/414 |
| 5,123,016 | 6/1992 | Müller et al. | 371/10.3 |
| 5,128,831 | 7/1992 | Fox, III et al. | 361/396 |
| 5,224,022 | 6/1993 | Weigler et al. | 361/409 |
| 5,266,833 | 11/1993 | Capps | 257/690 |
| 5,294,754 | 3/1994 | Wu | 174/255 |

FOREIGN PATENT DOCUMENTS

| | | | |
|---|---|---|---|
| 0268111 | of 1987 | European Pat. Off. | H05K 3/32 |
| 0354708 | of 1989 | European Pat. Off. | H01L 25/065 |
| 0476136 | of 1990 | European Pat. Off. | H01L 25/04 |
| 0535479 | of 1992 | European Pat. Off. | H01L 25/065 |
| 2170657 | of 1985 | United Kingdom | H01L 27/02 |

OTHER PUBLICATIONS

Y. C. Lee "Design of HWSI Multichip Modules for Quick Prototyping and Manufacturing", May 20-23, 1990, pp. 586–591, 40th ECTC/IEEE, Las Vegas, Nev.

*Primary Examiner*—Kevin J. Teska
*Assistant Examiner*—Stephen J. Walder, Jr.
*Attorney, Agent, or Firm*—Heslin & Rothenberg

[57] ABSTRACT

A method of fabricating a high density electronic package is disclosed. The package includes a module of laminated semiconductor chips, including spare chip(s) and a supporting substrate with a fixed interconnect pattern. Chip connection pads are provided at a first pad level of the module; one or more pads corresponding to each chip in the module. The module is tested at the first pad level to identify defective chip(s). A spare routing pattern is applied to the module for electrically isolating defective chip(s) and effectively substituting spare chip(s) therefor such that a predetermined pattern of metal interconnect landings on an access surface of the module remains unchanged, as does the supporting substrate.

55 Claims, 34 Drawing Sheets

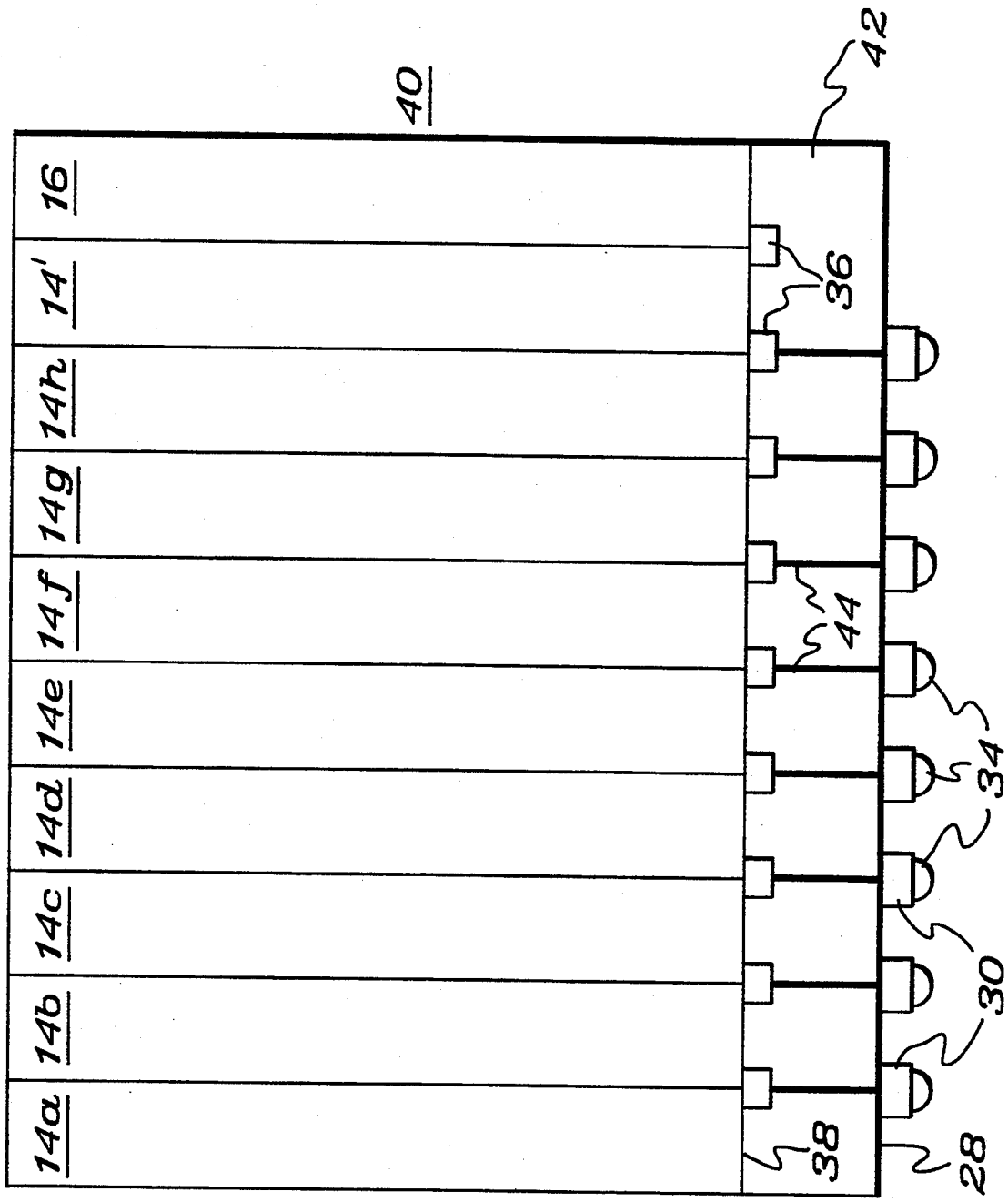

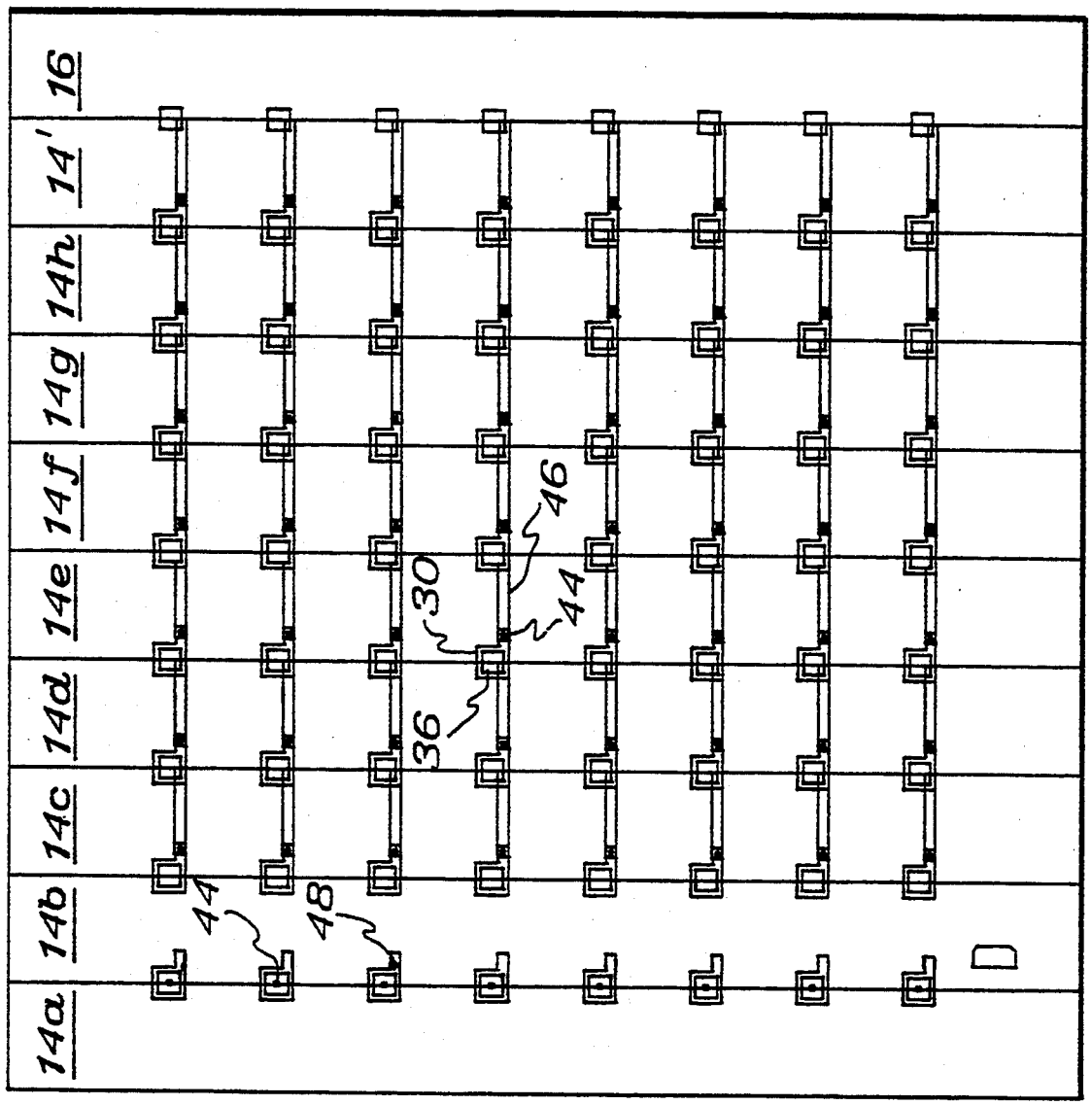

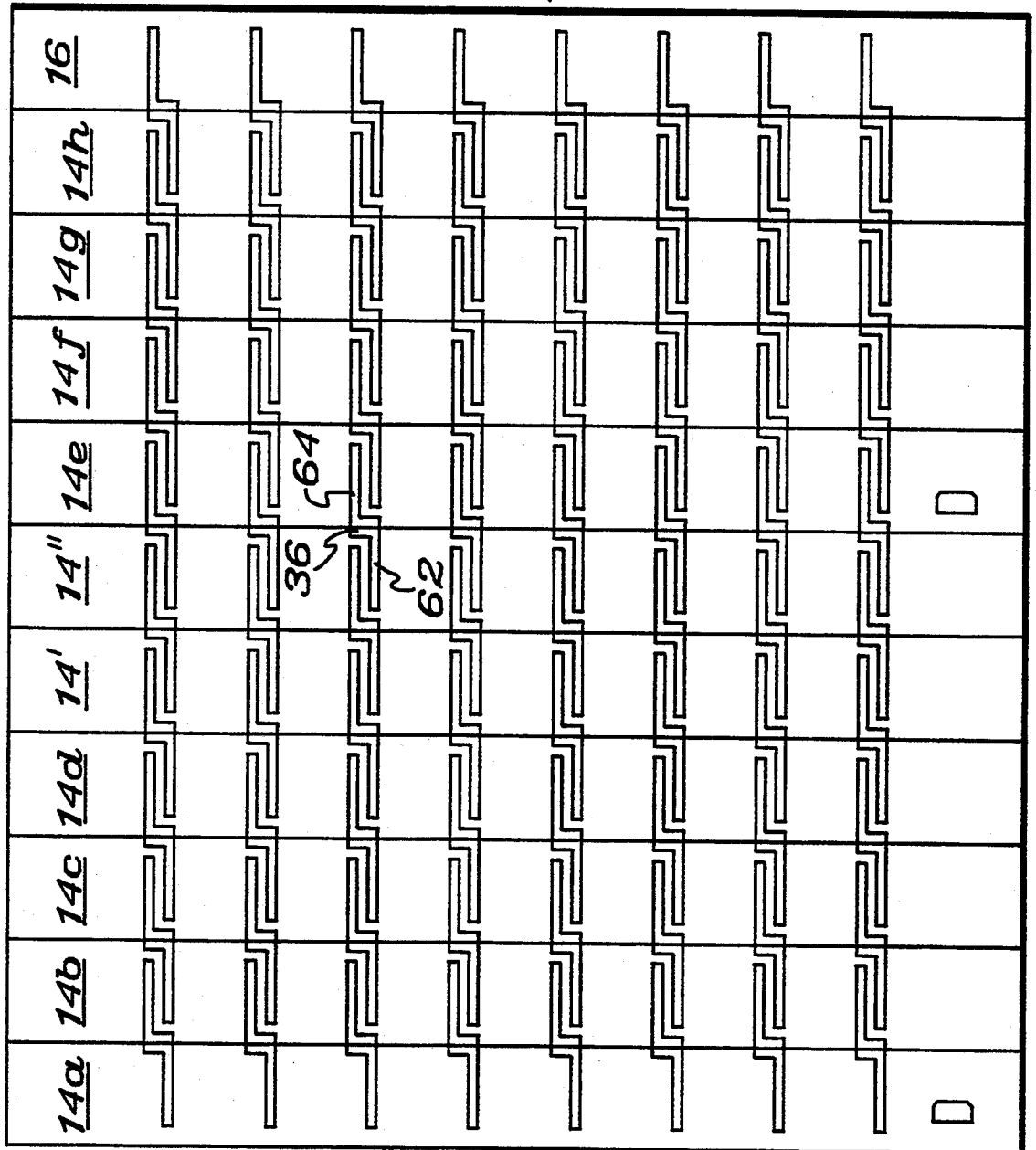

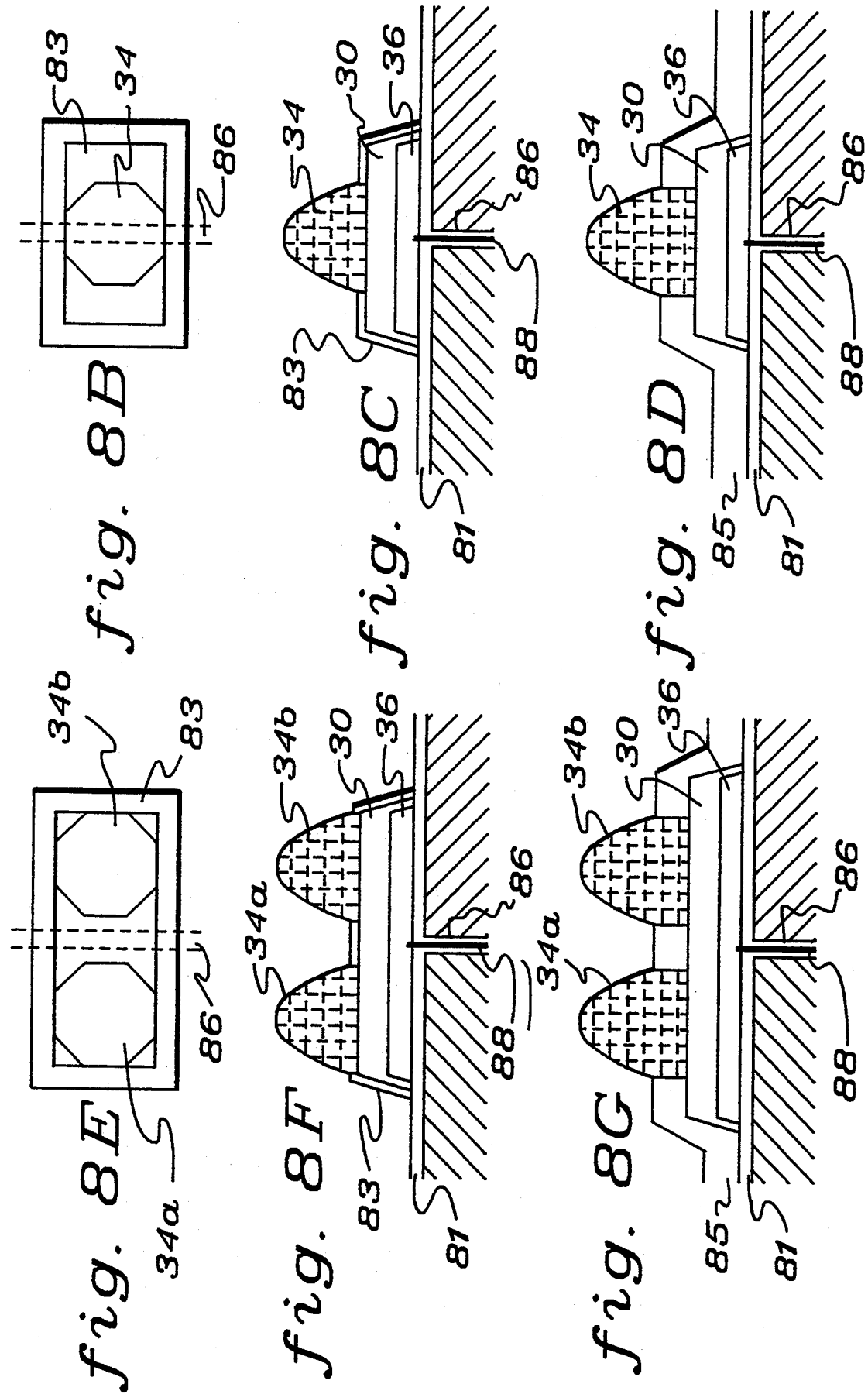

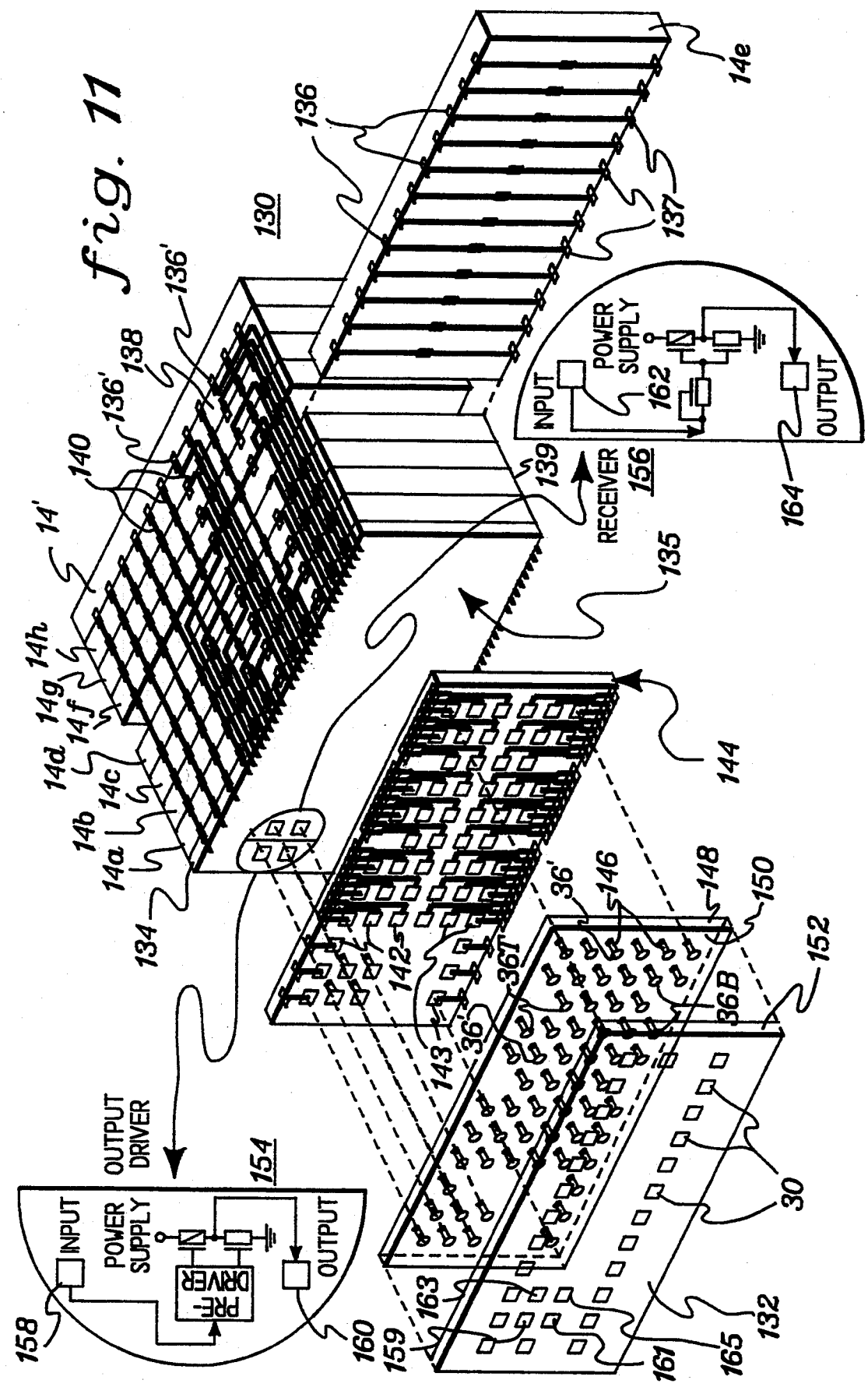

INTRA-MODULE SPARE ROUTING FOR HIGH DENSITY ELECTRONIC PACKAGES

BACKGROUND OF THE INVENTION

1. Technical Field

The present invention relates generally to fabrication of high density electronic packages and more particularly, to a method for replacing defective chips in a multichip module of an electronic package without disassembling the module or varying the module's interconnect footprint.

2. Background Art

In recent years, electronic packages composed of multiple laminated semiconductor chips (or layers containing integrated circuitry) have become popular due to their decreased volume and improved signal propagation speed. An example of such high density electronic packaging is found in U.S. Pat. No. 4,983,533, entitled "High-Density Electronic Modules-Process & Product," by Tiong C. Go.

A typical high density electronic package includes a module and interconnected supporting substrate. The module comprises a stack of integrated circuit layers bonded together. Each layer can contain one or more semiconductor chips. An interconnect metallization pattern is provided on an access surface of the module for electrical connection to the supporting substrate. The metallization pattern may include both individual contacts and bussed contacts. The metallization pattern of the module is positioned opposite a complementary interconnect pattern of the supporting substrate. Contacts of the interconnect metallization pattern on the module are typically bump bonded to complementary terminals of the interconnect pattern on the substrate. The bump bonding establishes a secure mechanical and electrical interconnection between the module and substrate of the electronic package. The substrate typically provides the package's interface to other assemblies.

While such high density electronic packaging provides significant improvements in volume and speed, utility is curtailed if one or more of the chips contained therein is defective. One prior art technique for repair of such a faulty package involves physically removing the defective chip or layer from the module and replacing it with a spare. Such a repair technique is disclosed in U.S. Pat. No. 5,019,946, entitled "High Density Interconnect with High Volumetric Efficiency." According to this earlier repair method, chips that are adhesively bonded together in a stack (module) are heated to the point where the adhesive softens enough to remove the defective chip. A good chip is then inserted and the interconnect metallization pattern on the stack is reapplied. The same general repair method is disclosed for use on a stack held together in a frame, except that the frame is dismantled to allow removal of the defective chip.

U.S. Pat. No. 4,983,533 discloses another method of repair for an electronic package. This technique employs redundant chips in the module. The module is formed with redundant chips and a pattern of metal connector contacts is applied on an access surface of the module to mate with a special customizable metal pattern on the substrate. The substrate's special metal pattern includes a separate chip conductor for connection to each chip, an interlinking conductor interconnecting the chip conductors and a reduced number of conductors leading from the interlinking conductor to external circuitry. If a defective chip is found, the defective chip's connector contacts and leads attached thereto on the access surface of the module are removed. Also, portions of the interlinking conductor on the substrate are removed to isolate the defective chip from the external circuitry and to connect the remaining nondefective chips and the redundant chips to the external circuitry. This repair approach thus necessitates altering the original metal pattern both on the access surface of the module and on the substrate when a defective chip is detected.

Thus, while the prior art does allow for repair of such high density electronic packaging, it does not do so on an efficient basis. Supporting substrates are generally earmarked for particular packages. Any custom changes to the metal pattern on the substrate are highly inefficient in terms of manufacturing resources. Further, the problem remains that repair of the module requires changes to the metallization pattern on the access surface of the module or dismantling of the module and handling of individual layers or chips. A need thus exists for a repair method that does not involve the dismantling of the module, the alteration of the module's interconnect pattern, or any changes to the supporting substrate.

DISCLOSURE OF THE INVENTION

Briefly, the present invention satisfies this need and overcomes the above-noted deficiencies through a repair method which includes: detecting a defective chip in a module prefabricated with a spare chip by testing the module at a first pad level; and applying a spare routing pattern to the module which electrically isolates the defective chip and accesses a spare chip in a manner so as to maintain a predetermined spatial arrangement of interconnect landings on an access surface of the module (i.e. the footprint), despite the presence of the defective chip, Thus, the module's final metal landing pattern connecting to a fixed metal terminal pattern on a substrate remains unchanged from that which would have resulted if no chip was defective. This allows the supporting substrate to remain unchanged, regardless of which chip is defective in the module.

For clarity, in describing the present invention, the term "pad" is used to denote an intermediary metal contact of the module while "landing" refers to a metal contact on an access or bonding surface of the module. The terms "layer" and "chip" are generally used interchangeably, although a given layer may include more than one chip. The term "footprint" refers to the predetermined pattern of interconnect landings on an access surface of a module.

According to the present invention, a module of laminated layers is provided with one or more spare layers. The number of spare layers incorporated in the module depends upon a desired percent module yield which is based on a binomial distribution and expected chip defect level. The module's laminated layers may be adhesively bonded or mechanically secured together. On a first surface of the module, pads are located for making electrical connections with the chips of the module. Testing of the chips in the module at this first pad level is then conducted in order to detect defective chip(s). Based on the results of the testing, a spare routing pattern is generated. For each defective chip, the spare routing pattern serves to electrically isolate the defective chip (totally or partially depending upon whether the chip is determined to be totally defective or partially usable) and to electrically integrate a spare chip into the module without requiring any alteration to the footprint of the module. The spare routing pattern is implemented by selectively applying metallization at, and/or metal filled vias between, the pad and landing levels of the module. The spare routing pattern connects a landing normally associated with the defective chip to an electrical connection pad associated with a nondefective chip, and connects a pad associated with the spare chip to an existing landing. The spare routing pattern can take various forms and can be implemented in various ways.

In one implementation of the spare routing pattern of the present invention, a metal pattern is applied to the first pad surface. The metal pattern may take the form of one or more leads extending from each of one or more pads, of one or more chips, to the vicinity of a corresponding pad of another chip. Leads may extend in one or more directions from an individual pad. The leads may be formed integral with the pads or added thereto. A lead may extend to the vicinity of a corresponding pad of an adjacent and/or a remote chip. A lead extends close to the corresponding pad but does not contact the corresponding pad. Such a lead extends from at least one pad of a spare chip and such a lead extends to the vicinity of at least one corresponding pad of a defective chip. A pad is considered to be in a "corresponding" relationship with another pad if it exhibits a spatial alignment or a functional equivalence therewith. Insulation is then placed over the pad and metal pattern surface. Next, a via is opened over each pad or a lead extending therefrom, except for corresponding pad(s) of defective chip(s), and any unused spare chip(s), in accordance with the desired spare routing pattern. All vias are then filled with metal. The predetermined pattern of landings for C4 joints or solder bumps is then applied on the insulation. The landings conductively connect to the metal filled vias. A landing may be provided with one or more tabs to facilitate connection with a proximate metal filled via overlying a pad lead. Use of pads with integral predefined leads in conjunction with complementarily shaped (e.g. tabbed) landings allows spare routing to be accomplished exclusively by selective location of vias.

According to another implementation of the present invention, a module is tested at a first pad level to detect a defective chip and insulation is selectively applied over at least one pad of the defective chip. A lead is then extended from a corresponding pad of a spare chip to a site on the insulation which overlies the original pad of the defective chip. The landing normally associated with the insulation covered original pad is then electrically connected to the lead at the site by either forming the landing directly atop the new pad or by forming a new pad at the site and connecting the new pad to the landing with a metal filled via. The latter technique facilitates via invariant spare routing.

In yet another embodiment of the present invention, each non-spare chip of a module is provided with at least one pair of spaced apart pads at a first pad level of the module. A first pad of each pair provides electrical connection to the respective chip while the second pad of the pair is connected to a particular landing on an access surface of the module. The pad pairs are generally on a different face of the module than the landings. For normal chip connection, a lead is formed at the first pad level interconnecting the first and second pads of a pad pair. In accordance with the principles of the present invention, one or more spare chips are incorporated into the module. Each spare chip has at least one spare pad at the first pad level. The spare pad is connected to the spare chip. When testing at the first pad level identifies a defective chip, the spare routing pattern of the present invention is implemented at the pad level by electrically isolating the first pad of the pad pair associated with the defective chip, and electrically connecting the second pad of the pad pair of the defective chip to a first pad of a corresponding pad pair of a nondefective chip or to a corresponding spare pad of a spare chip.

In yet another embodiment of the invention, the predetermined footprint of interconnect landings is provided on an end cap of a module. The end cap may comprise a dielectric material such as a ceramic or organic substance, or an active semiconductor layer. A spare routing pattern selectively connects the landings to a first set of chip connection pads of non-defective chips at a first pad level. The pads may be located on the end cap or on other face(s) of the module. An optional redundant set of chip connection pads may be provided at the first pad level to accommodate faults in conductive connections between the chips and pads of the first set. The incorporation of an active semiconductor layer in the end cap facilitates chip input/output connection through integrated circuitry, e.g. output drivers and receivers, on the active semiconductor layer, and sparing thereof. Judicious selection of the material comprising the end cap allows matching of the coefficient of expansion of the access surface of the module with that of a mating substrate.

In certain applications of the present invention, the spare routing pattern connects a set of pads of a spare chip directly to the spatially corresponding landings of a defective chip. In other applications, the spare chip pads may be connected to spatially corresponding landings of a non-defective chip, and spatially corresponding pads of a non-defective chip are connected to the spatially corresponding landings of the defective chip. In some instances, the spare routing pattern may connect individual pads of a spare chip to functionally corresponding landings of different partially defective chips. In the latter cases, a lead of the spare routing pattern on the first pad level may cross beneath a landing bus on the access surface of the module. The spare routing pattern may follow arbitrary paths or may be subject to imposed constraints such as minimizing individual lead lengths, or equalizing lead lengths. Spare routing may include bussed landings as well as individual landings.

With each embodiment of the invention, a bonding surface of the module (i.e. the surface of landings) can then be bonded to a substrate without changing the module's footprint or the substrate's fixed interconnect pattern.

These and other aspects, features and advantages of this invention will become apparent from the following detailed description of embodiments of the invention, taken in conjunction with the accompanying drawings.

BRIEF DESCRIPTION OF THE DRAWINGS

FIG. 3A is a side sectional view of a module section with one spare and no defective layers, also depicting a normal interconnection of pads and landings in such a module section;

FIG. 4E is a schematic illustration depicting superimposition of landings, vias, pads and leads of FIGS. 4C and 4D;

FIG. 6A is a pad level view of a different module section having two defective chips and two spare chips, and in which each pad is provided with a pair of transversely extending antisymmetric leads;

FIG. 8B is a plan view of a single bump individual landing of FIG. 8A;

FIG. 8C is a cross-sectional view of the single bump individual landing of FIG. 8B;

FIG. 8D is a cross-sectional view of a single bump individual landing of alternate construction;

FIG. 8E is a plan view of a double bump individual landing;

FIG. 8F is a cross-sectional view of the double bump individual landing of FIG. 8E;

FIG. 8G is a cross-sectional view of a double bump individual landing of alternate construction;

FIG. 11 is an exploded view of a module which accommodates spare routing on an active end cap and incorporates redundant chip wiring.

DETAILED DESCRIPTION

Introduction

Figure 1:
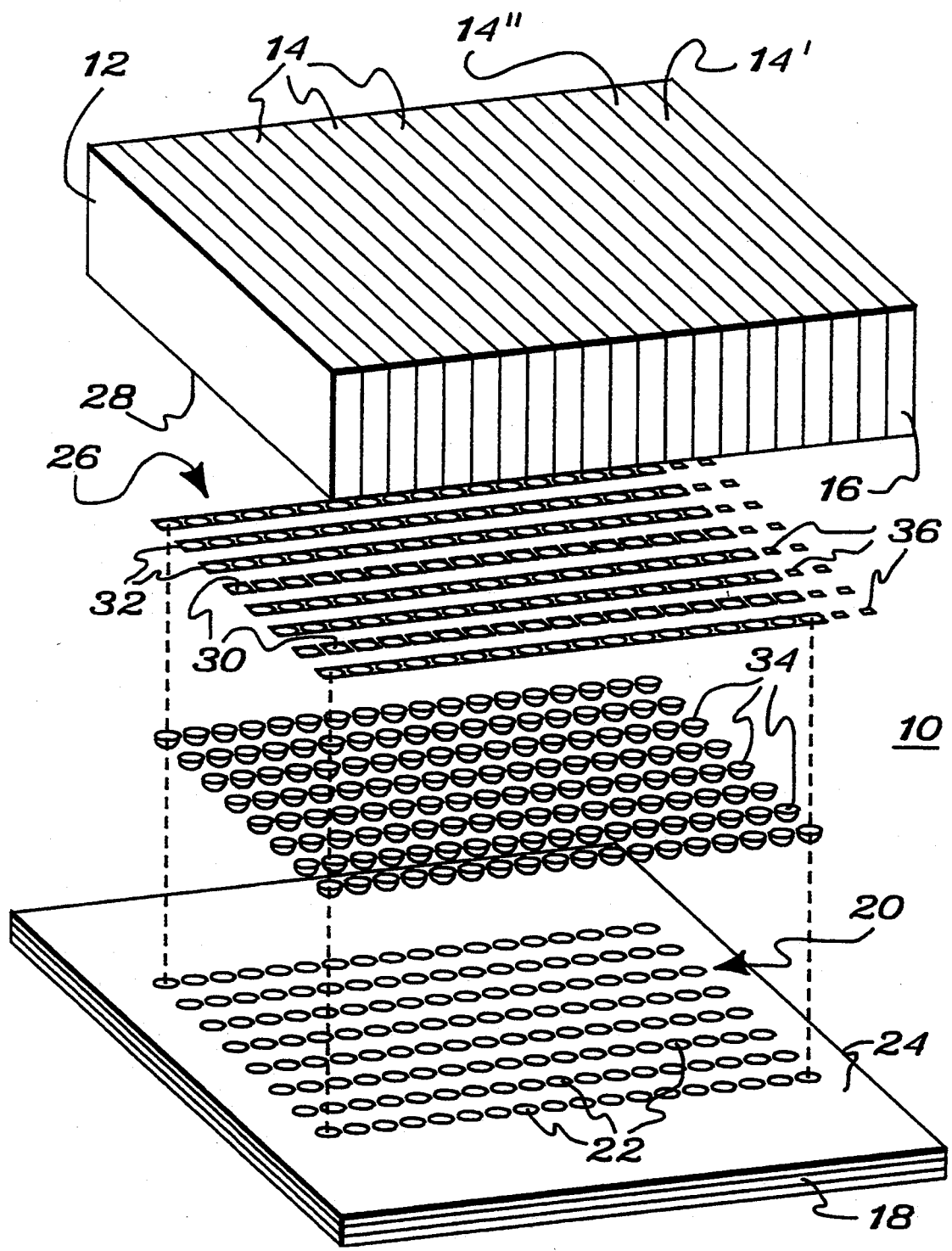
FIG. 1 is an exploded view of a multi-chip package provided with spare chips in accordance with the principles of the present invention.

The present invention relates to a method for substitution of good layers or chips for defective layers or chips in a multilayer or multichip package, such as package 10 depicted in the exploded view of FIG. 1. Package 10 includes a module 12 comprised of multiple laminated layers or chips 14, adhesively bonded or mechanically held together in a stack arrangement, A cap 16 may be provided on an end of module 12 to protect otherwise exposed chip connection wiring (i.e., transfer metal) of adjacent layer 14'.

Each layer 14 includes integrated circuitry, preferably in the form of one or more integrated circuit chips, e.g. silicon memory chips. All of the layers of the module may, but need not be, identical in function or size. For ease of description, the terms "layer" and "chip" are sometimes used interchangeably in this specification. All of the module layers are assumed to be of identical construction in the examples that follow, facilitating an "any for any" replacement of defective chips as more fully described hereinafter.

Module 12 is designed to be supported on, bonded to, and electrically connected through a substrate 18. Substrate 18 has a predetermined fixed pattern 20 of interconnect terminals 22 on a module facing surface 24 thereof. In known fashion, terminals 22 in conjunction with conductors (not shown) of substrate interconnect pattern 20 located on surface 24 or within substrate 18, connect module 12 to external circuitry.

A metallization pattern 26 is provided on an access or bonding surface 28 of module 12. Metallization pattern 26 typically includes rows of individual landings 30, and rows of landings connected in buses 32. Each column of metallization pattern 26 is associated with an individual layer 14 of module 12. Landings of module metallization pattern 26 are bonded to complementary terminals 22 of the substrate interconnect pattern 20 by respective intermediate solder bumps 34. Solder bumps 34 facilitate a secure mechanical and electrical interconnection between the module 12 and substrate 18. The landings of module metallization pattern 26 which mate to corresponding terminals 22 of the substrate interconnect pattern 20 form the landing footprint of the module.

In accordance with the principles of the present invention, this landing footprint remains invariant despite the presence of one or more defective chips in module 12. Module 12 is prefabricated with spare layers, e.g. 14' and 14'', each of which can, in effect, replace a defective layer of the module. Each spare layer is provided with a set of metal pads 36 connecting to the integrated circuitry of that layer. As more fully described hereinafter, spare layer pads 36 are used to implement an intra-module spare routing pattern which electrically isolates a defective layer and integrates the spare layer into the module, without varying the modules footprint.

Determination of Module Sparing Level

Module 12 is fabricated from individual chips which are initially 100% good. The chips are laminated together and then burned-in as a unit. These processes are likely to introduce a certain chip defect level and reduce the percent chip yield of the module below 100%. Based upon the expected percent chip yield and a binomial distribution, the percent of good modules for different sparing levels can be calculated in accordance with the following equation:

$$\sum_{0}^{m} \frac{n! \, Pf^m (1 - Pf)^{n-m}}{m!(n-m)!}$$

where:
n = Total number of chips in the module;
m = Number of spare chips;
n-m = Desired number of good chips in the module; and
Pf = Average probability of chip failure in the module assembly.

Figure 2:
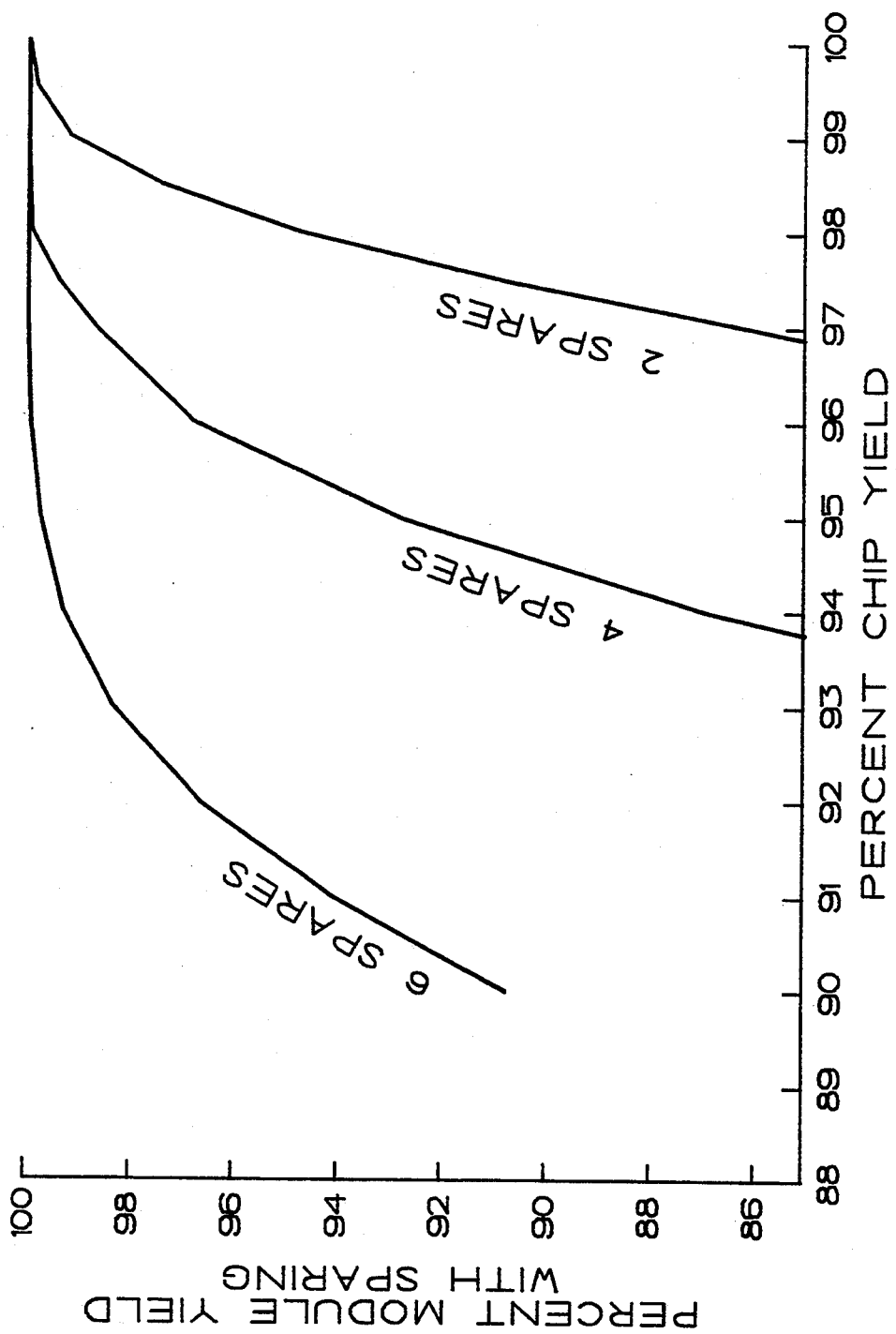
FIG. 2 is a graph useful in explaining how the number of spare chips included in a multi-chip module may be determined in accordance with the principles of the present invention.

The desired number of good chips in a module will depend upon the intended application and other factors. A typical module might include 32 active chips, 7 additional chips for parity and error correction, and perhaps 2 field spares, for a total of 41 good chips. To determine an appropriate number of manufacturing spare chips in a module requiring 41 good chips, various levels of sparing (i.e. number of spare chips) can be plugged into the above equation and the results graphed as shown in FIG. 2.

Assuming a 95% chip yield (i.e. a 5% chip defect level due to lamination and burn-in), the percent module yield at different sparing levels can be determined. For example, at 95% chip yield, it is evident, from FIG. 2 that two spares are insufficient. Six spares, on the other hand, would provide a percent module yield of virtually 100% which may be more than is needed for commercial purposes. Inclusion of 4 spares would result in about 94% module yield. Assuming some rework capability which would further reduce the number of nonusable modules, the inclusion of four spares in a module designed to contain 41 operational chips is expected to provide a commercially viable product.

Nondefective Module Section

The principles of the present invention can be applied to a module of any size, assuming that sufficient spares are included in the module. In many cases, symmetry, low I/O (input/output) and relatively low defect levels will permit a large size module to be partitioned for sparing purposes into smaller module sections.

Figure 3B:
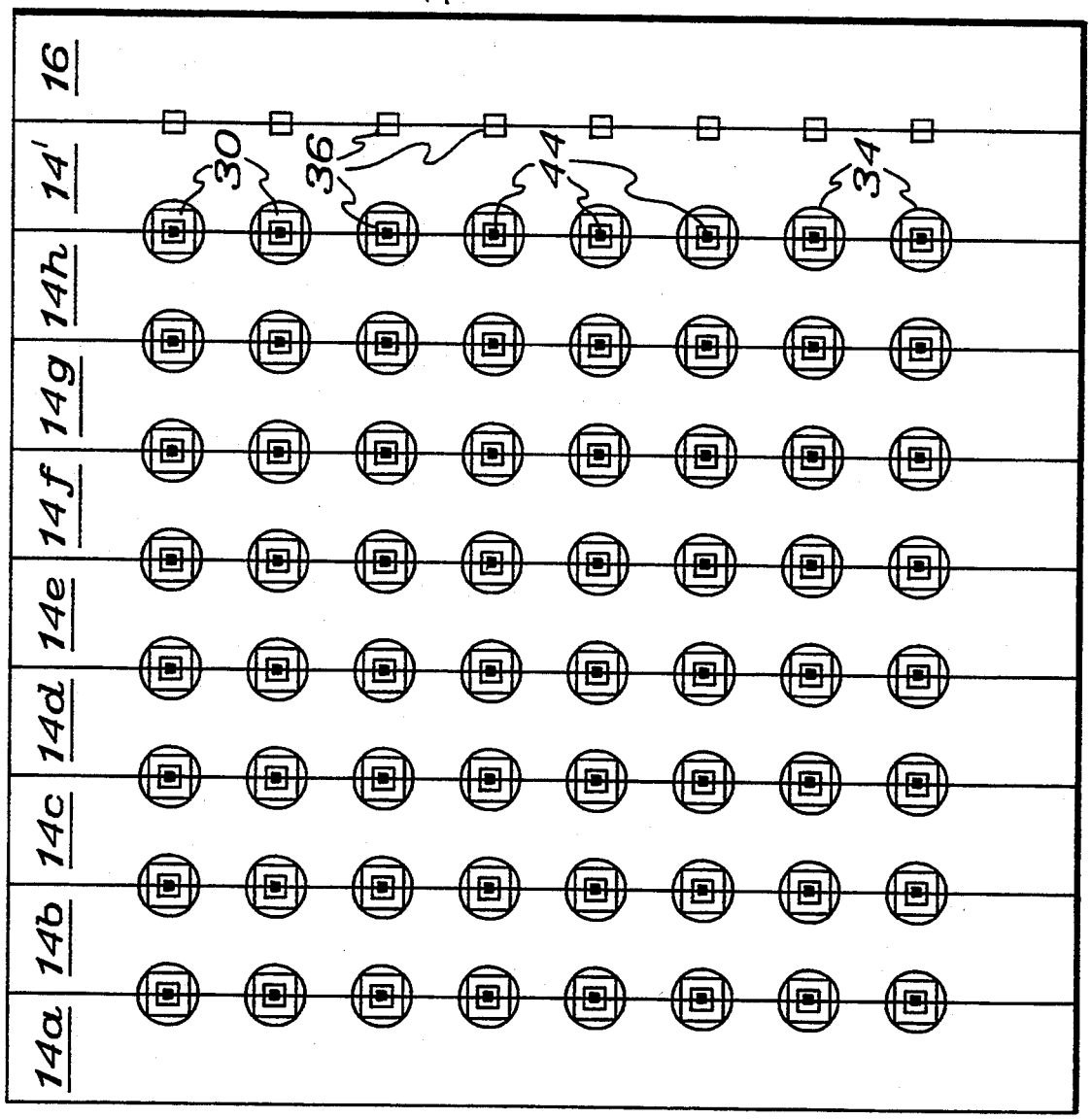
FIG. 3B is a schematic bottom view of the module section of FIG. 3A.

FIGS. 3A and 3B illustrate a typical module section 40 consisting of eight operational chips 14a–h, a spare chip 14' and an end cap 16. Each chip of module section 40 has a set of metal electrical connection pads 36 (sometimes called T-connections) that, in known fashion, provide connection to the integrated circuitry of the respective chip. In the schematic bottom view of FIG. 3B, each pad 36 is represented by a small unfilled square. Each column of pads 36 in FIG. 3B provides connections for the chip to the left of the column of pads. Pads 36 are formed on a first pad level 38 of the module in conventional fashion. It will be understood by those skilled in this art that such a pad arrangement could be provided on more than one surface of a module. Also, the module need not be cube shaped and a pad surface need not be planar.

Module section 40 also has a predetermined pattern of interconnect landings 30 on an access surface 28. In the embodiment of FIG. 3A (and in subsequent similar embodiments), access surface 28 is separated from first pad level 38 by a layer of insulation 42. In a module section having no defective chips, metal filled vias 44 connect landings 30 to pads 36 of the operating chips 14a–14h. Landings 30 which mate with complementary terminals of the substrate interconnect pattern are provided with solder bumps 34. The techniques for applying insulating layer 42, opening and subsequent metal filling of vias 44, formation of metal landings 30 and application of solder bumps 34 are all well known in the art. In a defect-free module section, the pads of spare chip 14' are not connected to the interconnect landings of the module footprint.

In the schematic illustration of FIG. 3B, the pads 36 on the pad level, metal filled vias 44 extending through insulation 42, landings 30 on access surface 28, and solder bumps 34 are shown superimposed. In FIG. 3B and subsequent similar schematic illustrations, the small filled rectangles represent metal filled vias; the small unfilled rectangles represent pads 36; the larger unfilled rectangles represent landings 30 and the enclosing substantially circular forms represent solder bumps 34. The cross-sectional shape and extent of these elements may, of course, vary from that shown. For ease of illustration, solder bumps 34 are shown exaggerated in relative size. In the defect-free module section of FIG. 3B, a solder bump 34, associated landing 30, associated metal filled via 44 and associated pad 36 of a non-spare chip, are preferably axially aligned.

The application of spare routing patterns to module sections containing defective chip(s) will now be described.

General Spare Routing

Figure 4A:
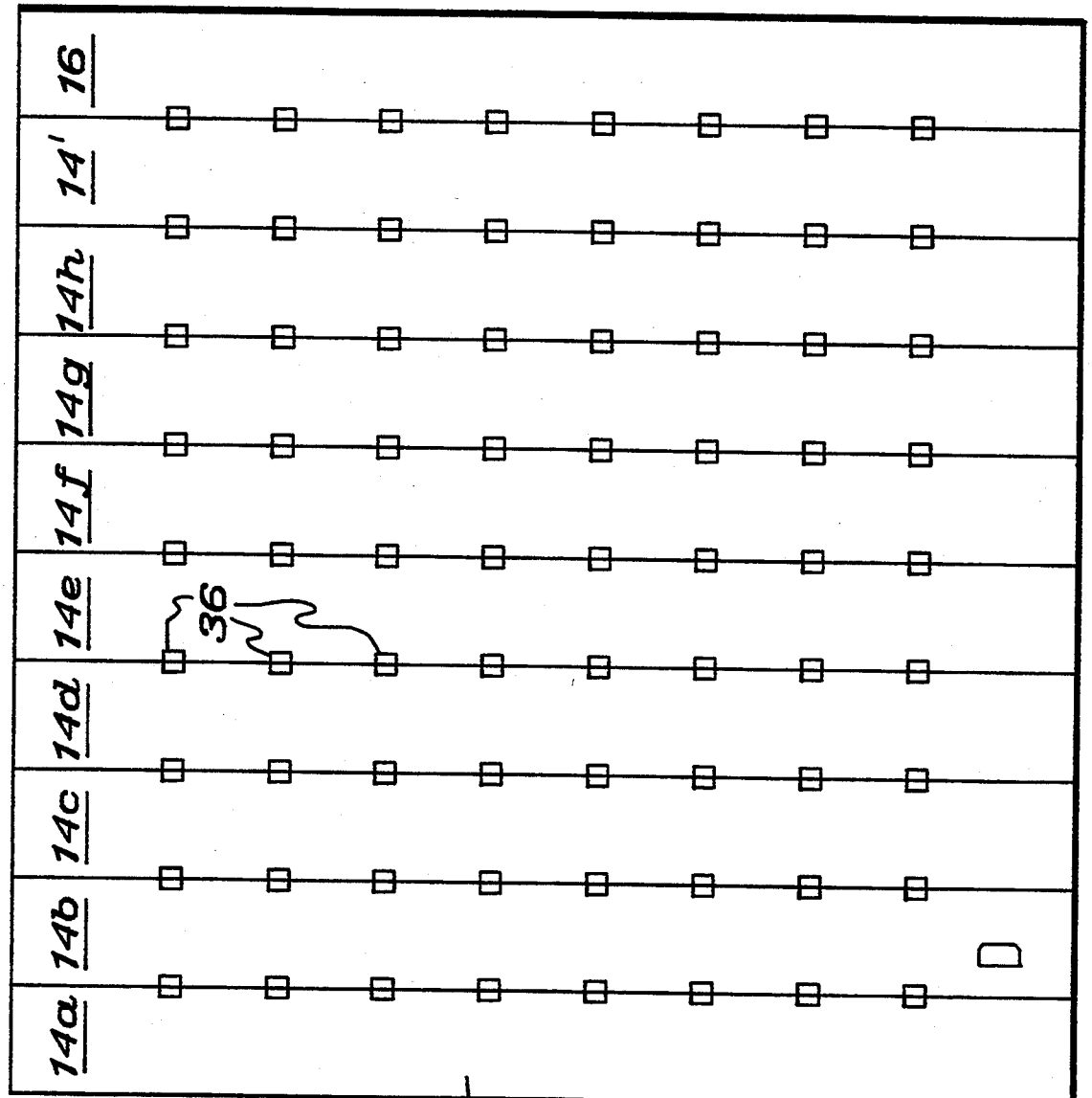
FIG. 4A depicts the pad surface of an exemplary module section having one spare layer and one defective layer.

FIG. 4A depicts the pad level 38 of module section 40. According to the method of the present invention, a module is tested at the pad level, subsequent to lamination and burn-in, to identify any defective chips. By connecting a set of test probes to the pads 36 of the chips of the module and applying conventional testing methods, one or more defective chips, e.g. chip 14b, in module section 40 can be detected. In the drawings, defective chips are identified by "D".

The results of testing are used to determine a spare routing pattern to accommodate the particular defects found in testing. The general goal of the spare routing pattern is to electrically isolate a defective chip (e.g. 14b) and to access a spare chip (e.g. 14') without necessitating a change in the pattern of interconnect landings to be applied to the access surface of the module, thereby ensuring that a previously fabricated supporting substrate need not be altered to accommodate defects in the module. The spare routing pattern can take various forms and be implemented in various ways. Such factors as the intended end use of the package, constraints in the manufacturing process, cost considerations, operational characteristics, etc. may influence the layout and implementation of the spare routing pattern. Various examples of different spare routing patterns are presented hereinafter.

In general, the spare routing pattern of the present invention connects landings normally associated with a defective chip to corresponding pads of a nondefective chip. This connection may be made directly to the pads of the spare chip or to corresponding pads of a nondefective operational chip. In the latter case, the corresponding pads of the spare chip are also connected to landings normally associated with corresponding pads of a nondefective chip. Pads are considered to be "corresponding" when they are spatially aligned (i.e. in the same row) or functionally equivalent. The spare routing pattern can be implemented by applying metallization at the pad and/or landing levels, or by judicious location of metal filled vias, or a combination thereof. Metallization application in combination with via location selection allows for "any for any" spare substitution even in a large module. Metal invariant implementations hold the promise of reduced manufacturing costs. Via invariant approaches may also provide manufacturing efficiencies.

Figure 4B:
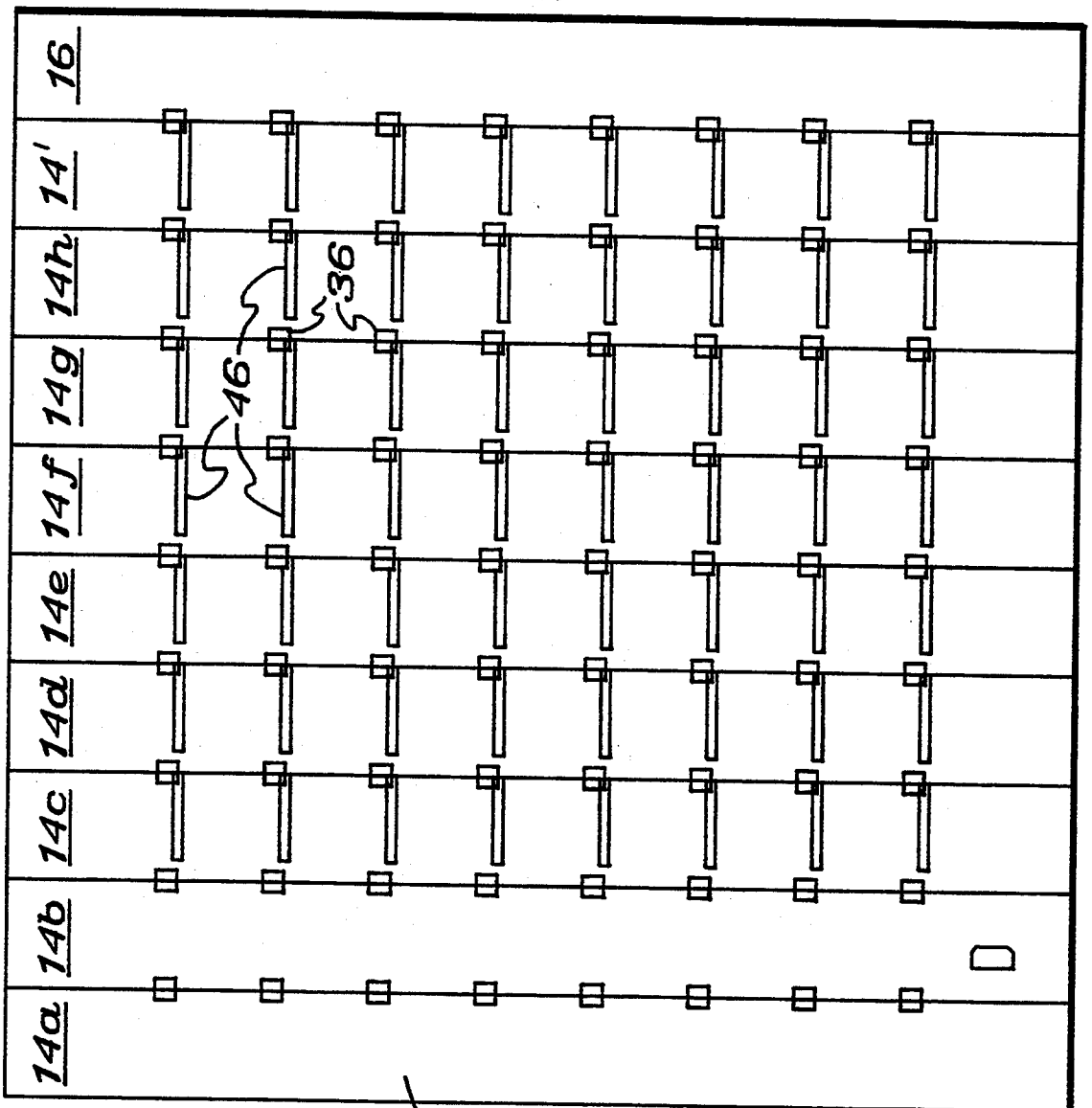
FIG. 4B depicts the pad surface of FIG. 4A after separate pad leads have been added.

Turning now to FIGS. 4A–4G, a spare routing pattern implemented by application of additional metallization on the pad and landing levels, and judicious location of metal filled vias will now be described. Assuming that testing at the first pad level (FIG. 4A) identifies chip 14b as defective, leftwardly extending metal leads 46 (FIG. 4B) are added to all of the pads 36 on pad surface 38 except those of chips 14a and 14b. Each lead 46 extends from a pad 36 to the vicinity of the corresponding pad of an adjacent chip. Each lead terminates near, but does not contact the corresponding pad of the adjacent chip, as shown in FIG. 4B.

Conducting leads 46 may be created by first applying a photoresist on the pad surface. The leads can then be formed using a conventional optical masking technique or a conventional electron beam writing technique. Both techniques are widely known in the art and will not be discussed further herein.

Figure 4C:
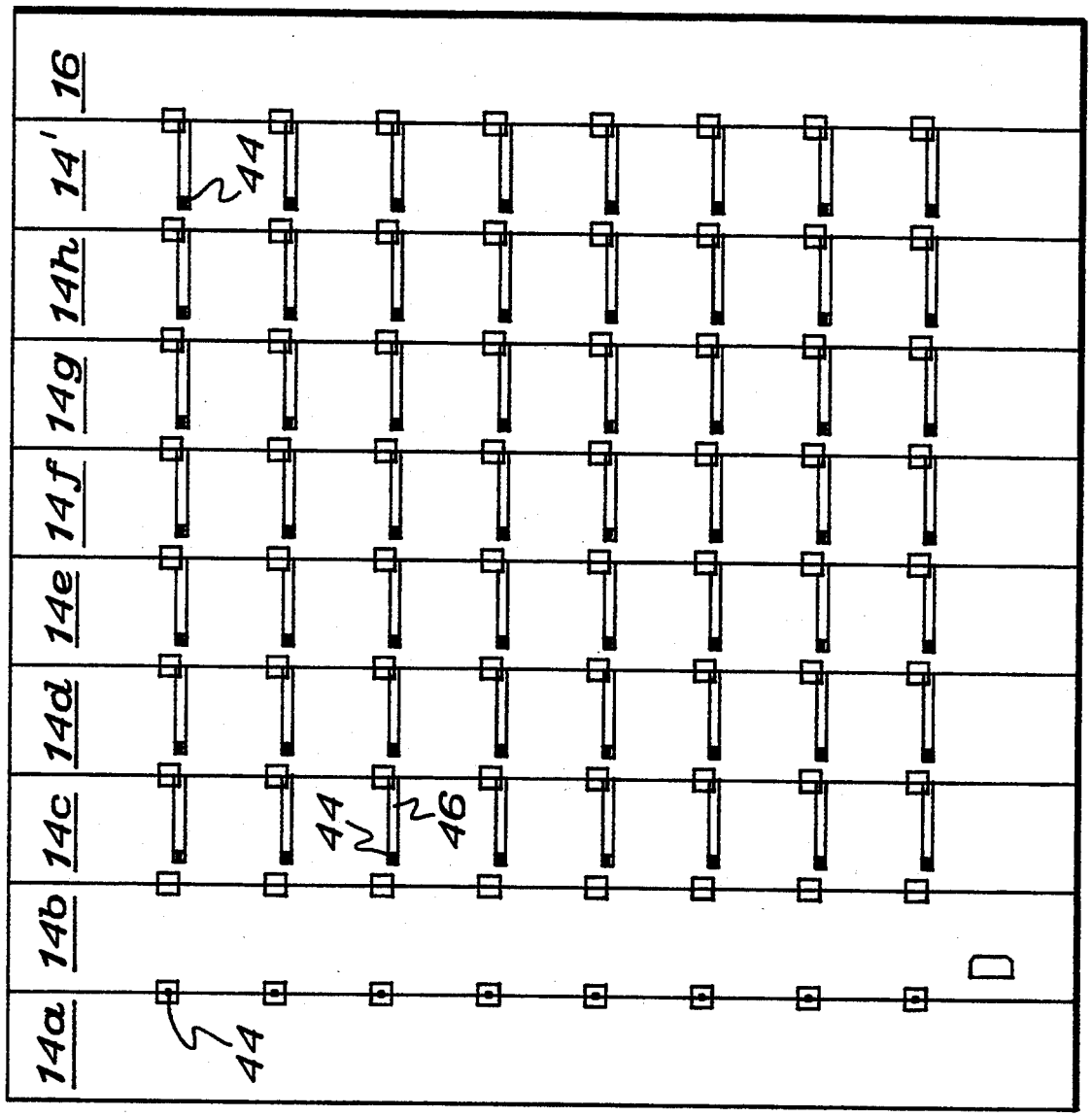
FIG. 4C depicts the module section of FIG. 4B with metal filled vias above the pad level.

After the pattern of conducting leads 46 is added to the pad level 38, insulation 42, preferably a polyimide insulator (e.g., DuPont 2611), is applied over the pad level. Vias are selectively opened through the insulation. As shown in FIG. 4C, vias 44 are opened directly over the pads of chip 14a, and also over the remote end or terminus of each lead 46 connected to a pad of nondefective chips 14c–14h and spare chip 14'. No vias connect with the pads of defective chip 14b.

Vias 44 are etched or otherwise opened in insulation 42, and then filled with metal, using well known techniques.

Figure 4D:
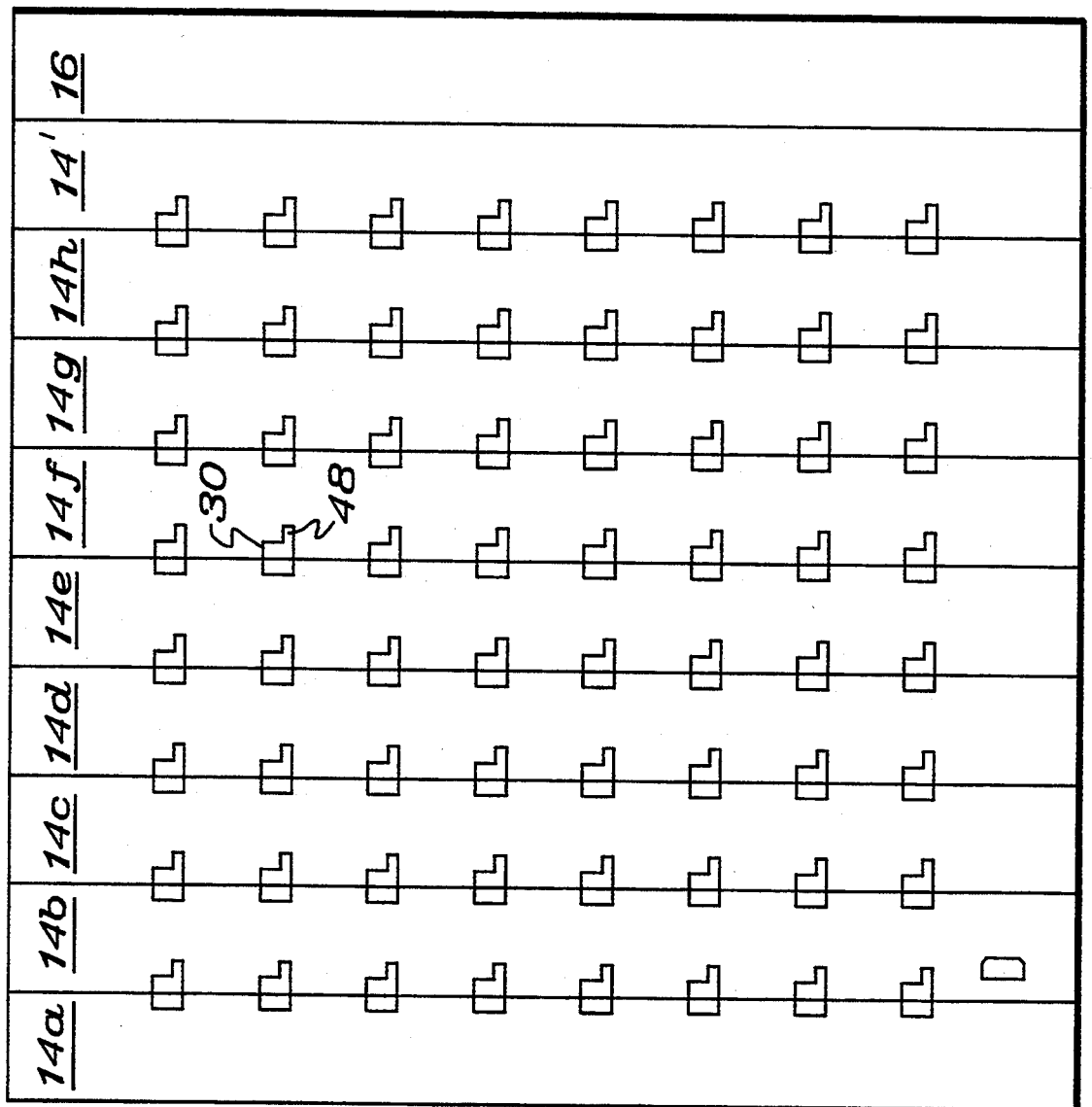
FIG. 4D depicts a pattern of specially shaped landings for the module section of FIG. 4A.

The desired predetermined pattern of metal landings is then applied on top of insulation 42. As shown in FIG. 4D, each landing 30 may be provided with a rightwardly extending metal tab 48. Tabs 48 are sized and positioned to overlie metal filled vias 44 at the remote ends of leads 46, as shown in FIG. 4E.

Figure 4F:
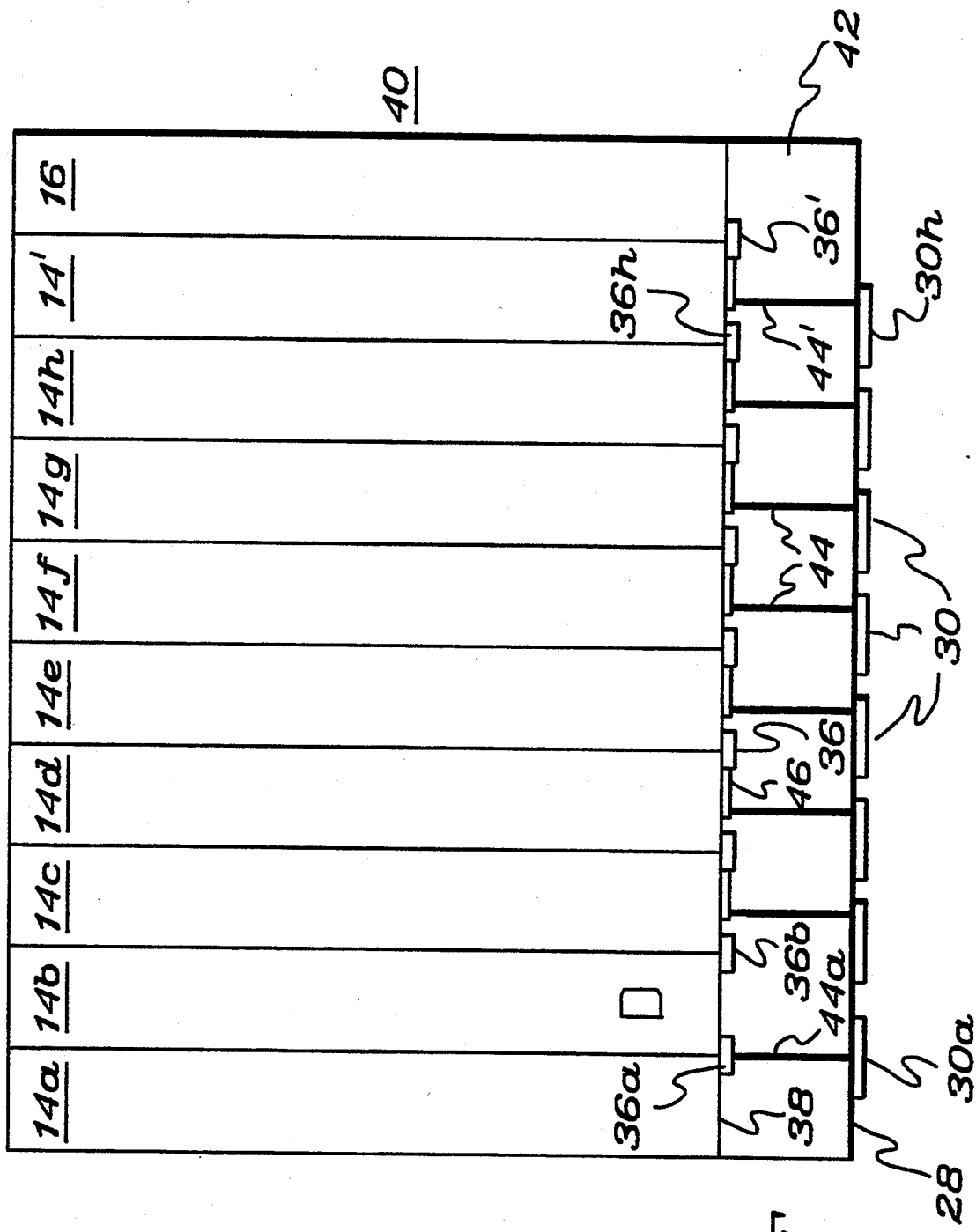
FIG. 4F is a sectional view of the module section of FIG. 4E.

The resulting structure is shown in cross-section in FIG. 4F. Note that the pads (e.g. 36a) of nondefective chip 14a are connected by metal filled vias (e.g. 44a) to the landings (e.g. 30a) normally associated therewith. On the other hand, the pads (e.g. 36b) associated with defective chip 14b are electrically isolated from landings 30, while the connections for pads 36 of nondefective chips 14c–14h are, in effect, shifted left to contact the landings of the next chip. Finally, the pads (e.g. 36') associated with spare chip 14' are now connected by metal filled vias (e.g. 44') to the landings (e.g. 30h) normally associated with the corresponding pads of chip 14h.

Figure 4G:
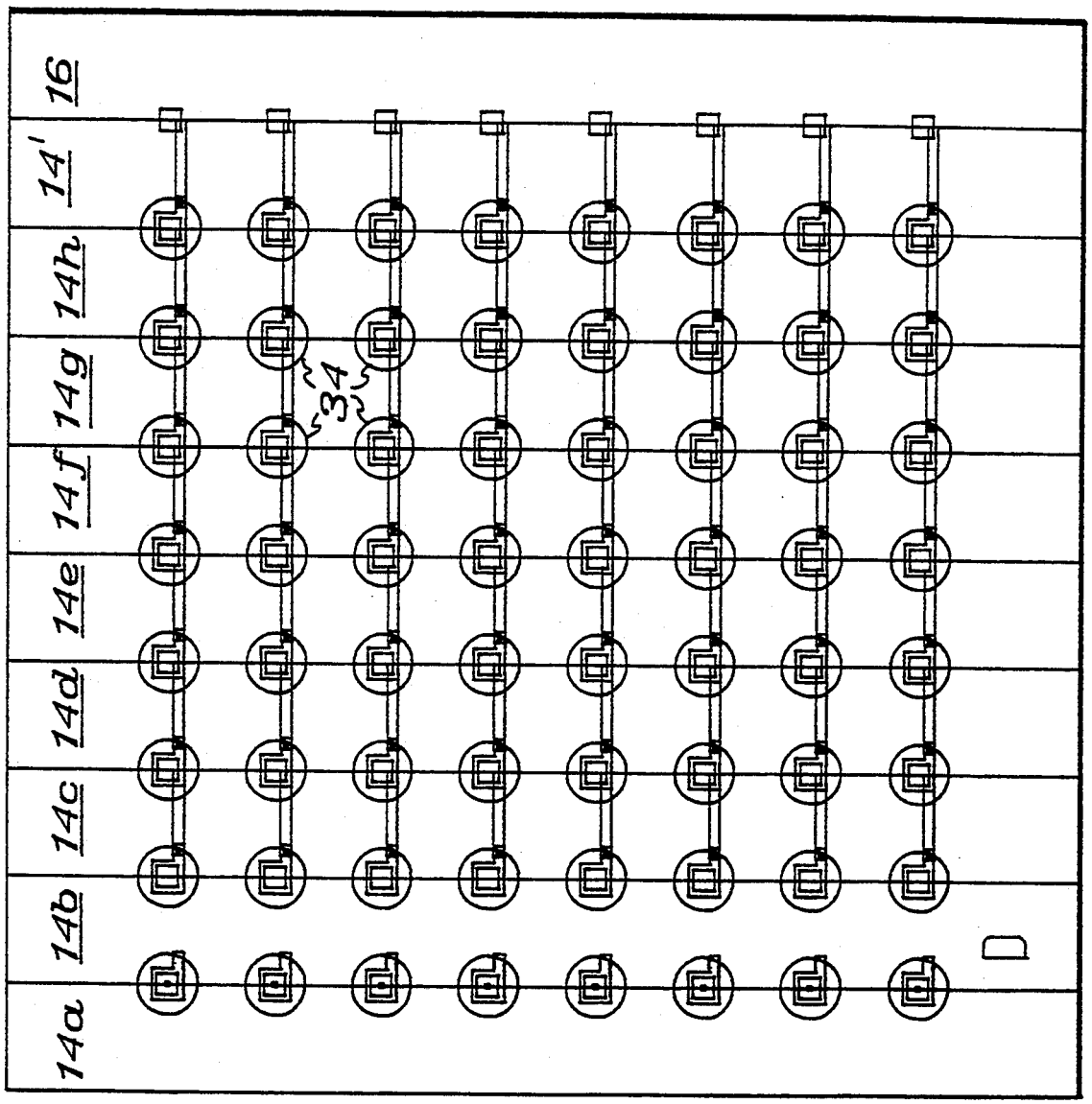
FIG. 4G is a schematic bottom view of the module section of FIG. 4E with solder bumps added.

FIG. 4G schematically illustrates the addition of solder bumps 34 to the module section of FIG. 4E. Comparison to FIG. 3B indicates that the footprint of the module section 40 has remained invariant despite the presence of defective chip 14b and the integration of spare chip 14' in the module section.

Metallization Invariant Spare Routing

To minimize manufacturing costs, it may be desirable in certain instances to implement the spare routing pattern by varying only the location of metal filled vias. A simple metal invariant approach is illustrated in FIGS. 5A–5D.

Figure 5A:
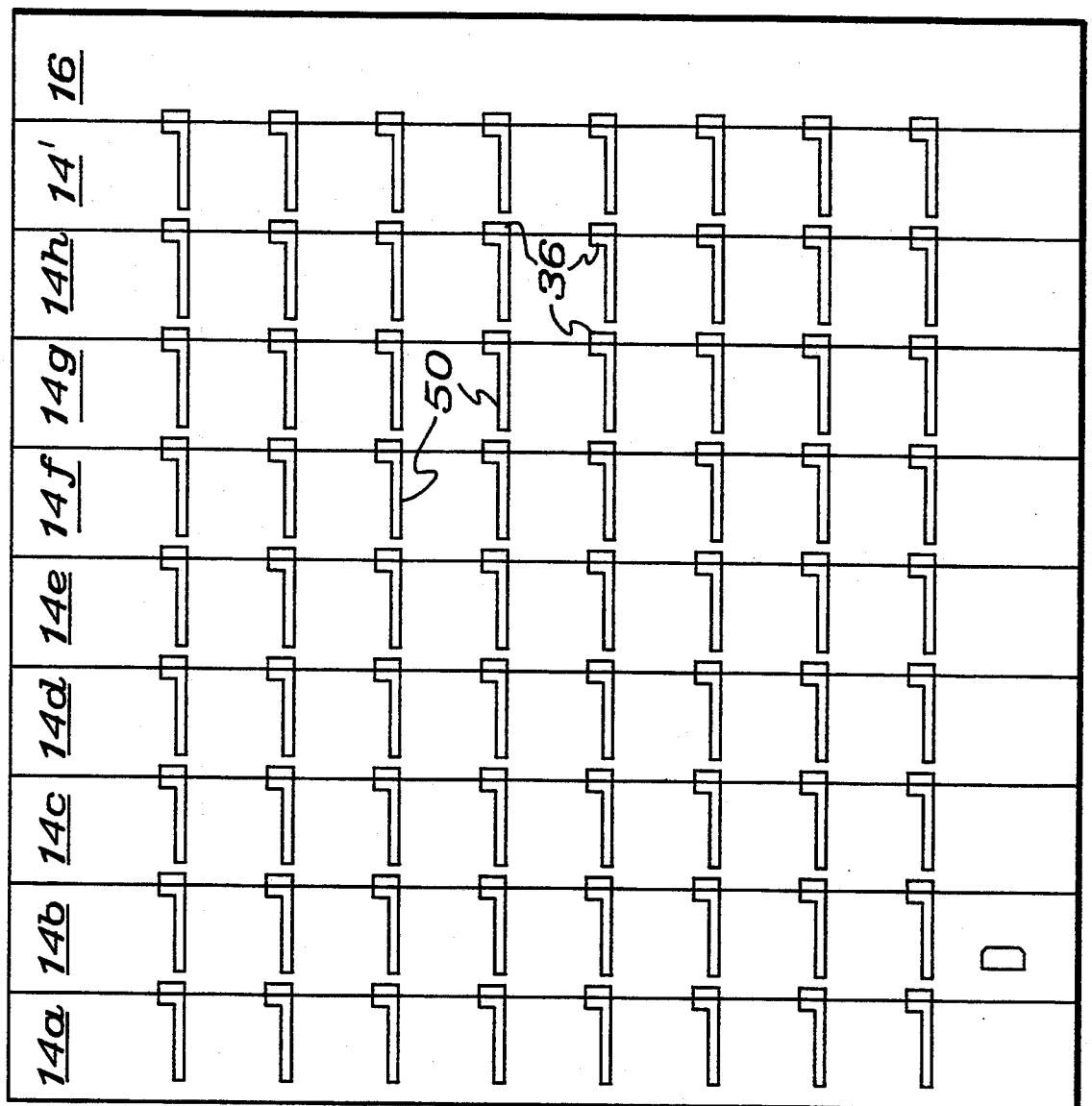
FIG. 5A is a pad level view of a module section wherein each of the pads is provided with an integral lead extending in a single direction.
Figure 5B:
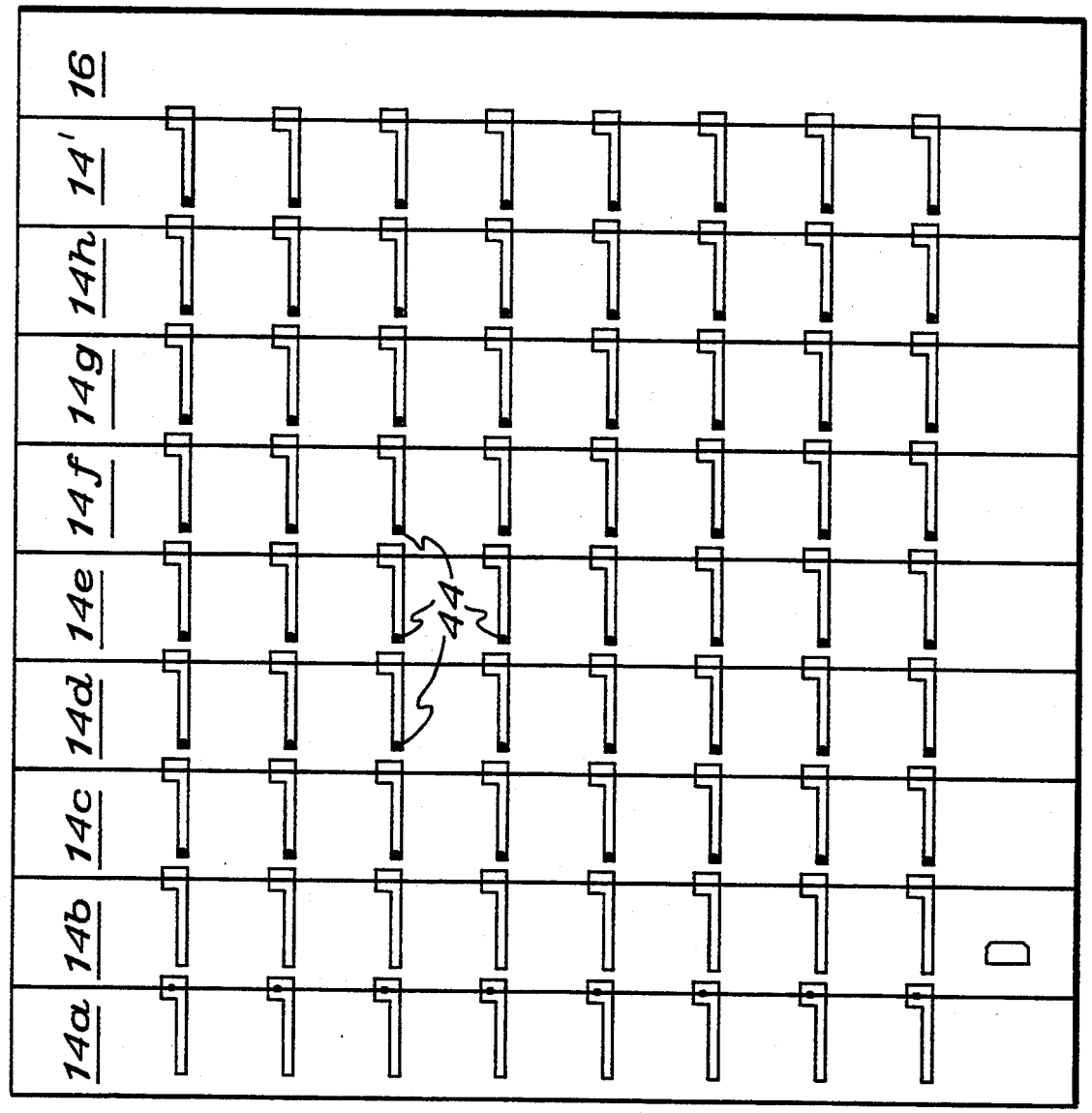
FIG. 5B depicts a via pattern for the module section of FIG. 5A.
Figure 5C:
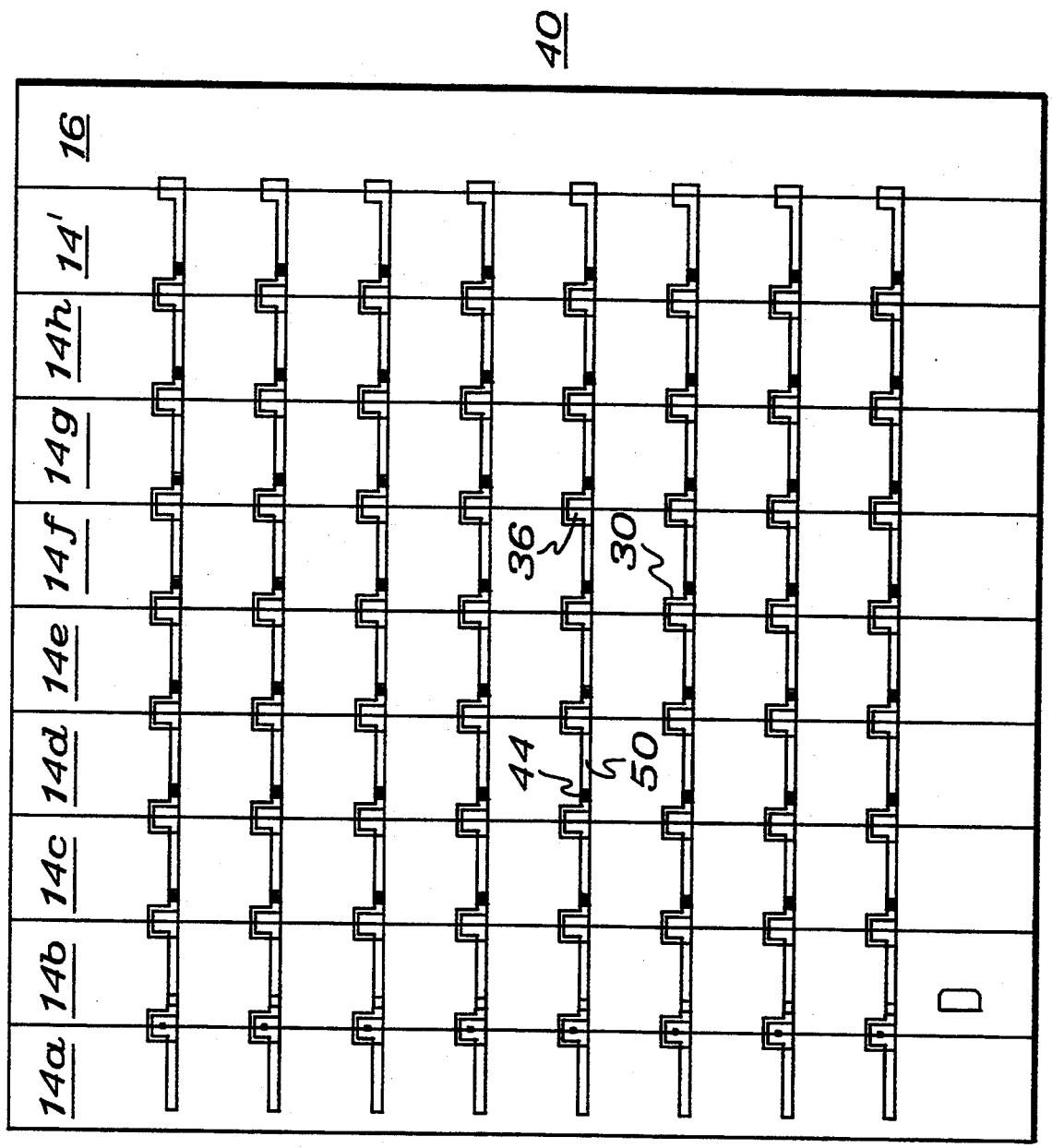
FIG. 5C is a schematic view showing the superimposition of the landing pattern of FIG. 4D on the module section of FIG. 5B.
Figure 5D:
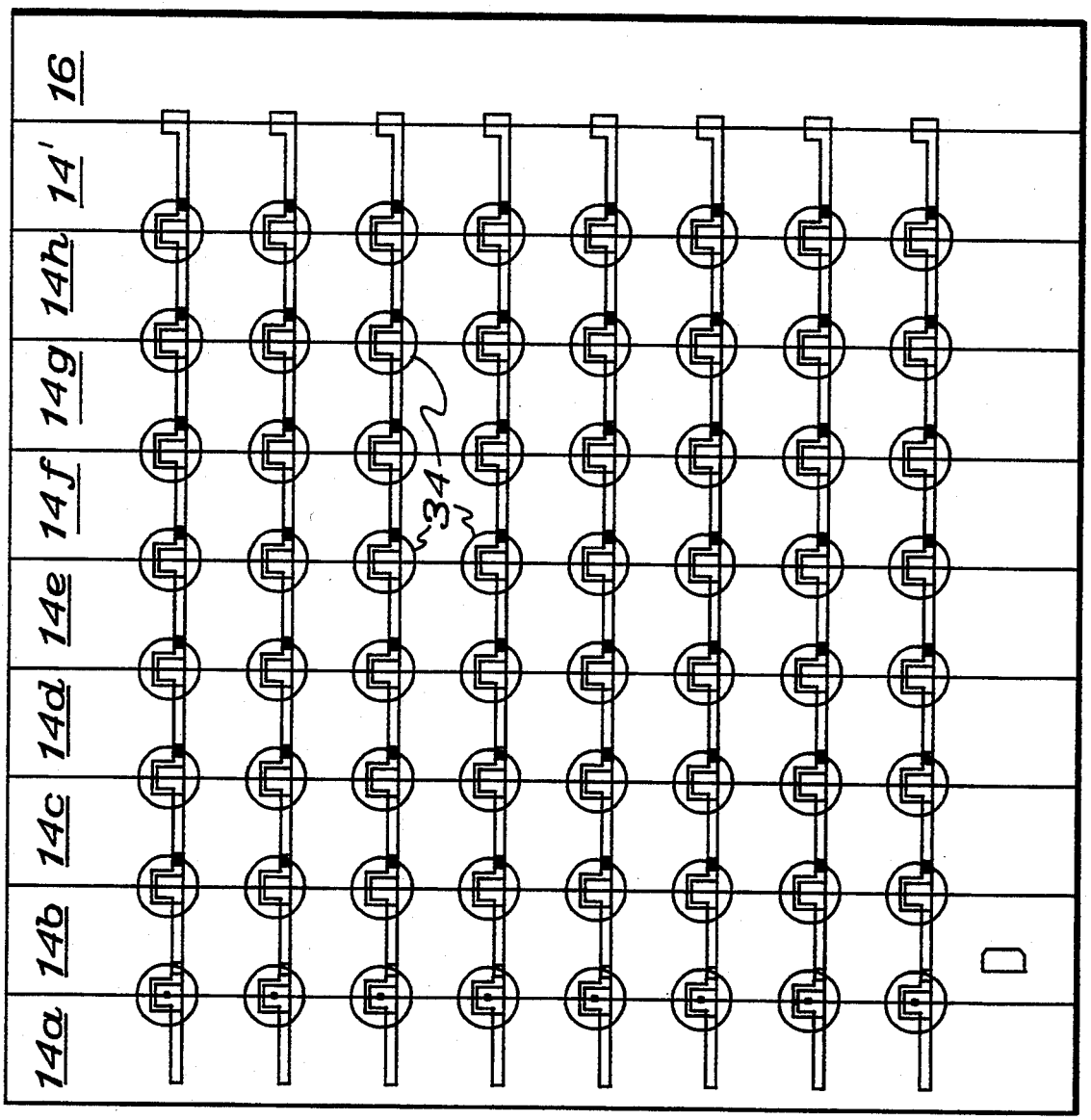
FIG. 5D schematically illustrates the addition of solder bumps to the module section of FIG. 5C.

As shown in FIG. 5A, each pad 36 of module section 40 is formed with an integral leftwardly extending lead 50. Leads 50 extend to the vicinity of, but do not contact, the corresponding pad of an adjacent chip. The resulting metal pattern on the pad level 38 is similar to that shown in FIG. 4B of the previous example. Likewise, for a module section 40 in which chip 14b is defective and chip 14' comprises a spare, the pattern of metal filled vias 44 (FIG. 5B) and of tabbed landings 30 (FIG. 4D) can be identical to the prior example. The resulting superimposition of landing, via and pad patterns is schematically illustrated in FIG. 5C. As shown in FIG. 5D, the final footprint of interconnect landings remains invariant.

The simple metal invariant case of FIGS. 5A–5D can be extended to facilitate pad shifting in multiple directions. FIG. 6A provides a pad level view of a module section 60 in which two spare chips, 14' and 14" are located in the middle of eight operational chips 14a–14h. Assume that pad level testing indicates that chips 14a and 14e of module section 60 are defective.

In this metal invariant implementation, at the pad level 38, each pad 36 is provided with a pair of antisymmetric leads 62 and 64. Lead 62 jogs leftward to the vicinity of a corresponding pad of an adjacent chip, while lead 64 jogs to the right extending to the vicinity of a corresponding pad of an adjacent chip. In this metal invariant implementation, leads 62 and 64 are formed integral with pad 36 in conventional fashion. The antisymmetric leads 62 and 64 facilitate pad connection shifting to a chip landing on the left or on the right.

Figure 6B:
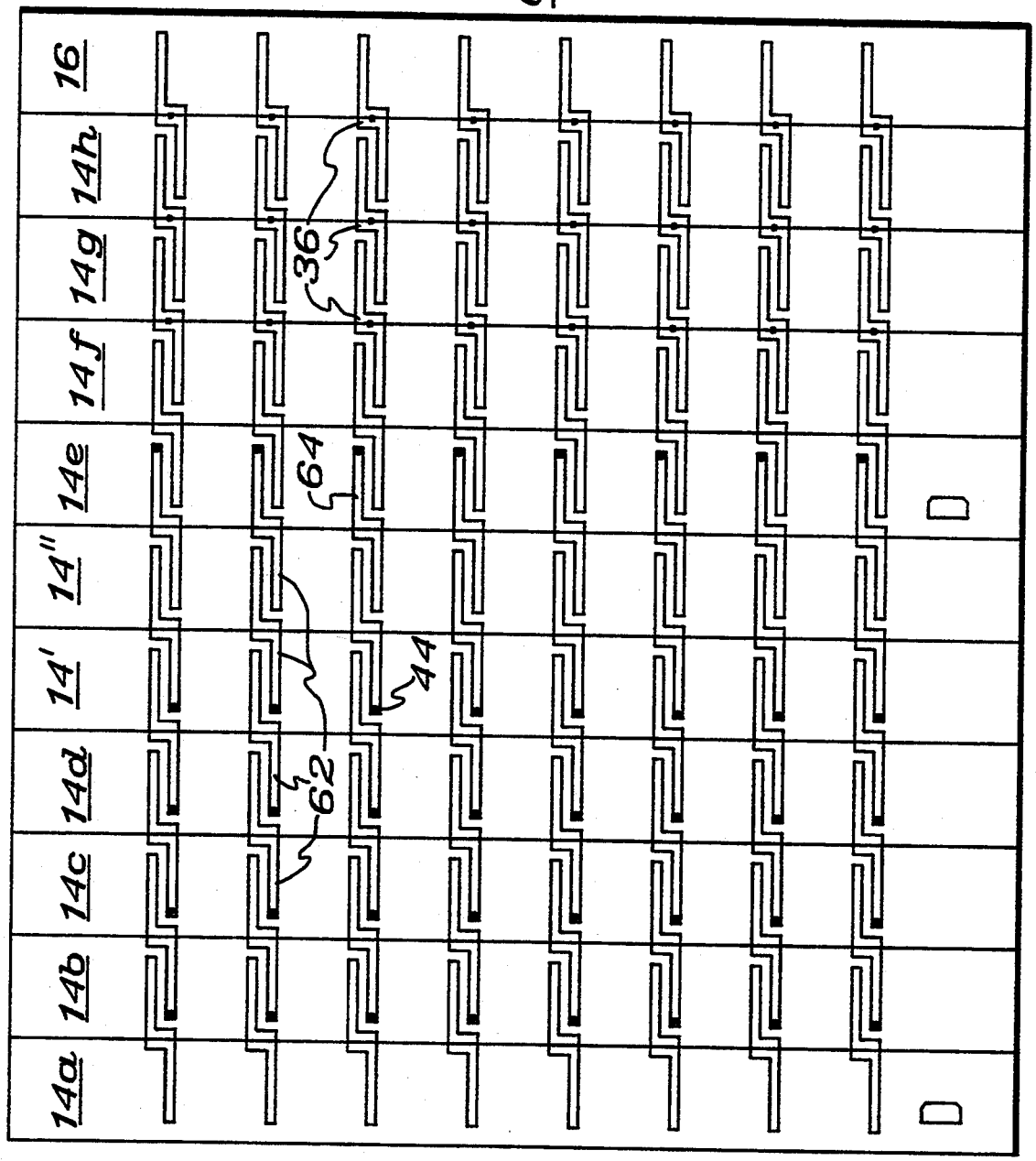
FIG. 6B depicts a via pattern for implementing a spare routing pattern on the module section of FIG. 6A.

As in the previous examples, insulation is applied over the pad level, and vias selectively opened through the insulation. FIG. 6B illustrates a pattern of metal filled vias for implementing a spare routing pattern on the module section 60. No vias are opened over the pads or associated antisymmetric leads of defective chips 14a and 14e. These chips are thus electrically isolated from the landing pattern of the module section. Metal filled vias 44 are positioned over the remote ends of leftwardly extending leads 62 of nondefective chips 14b, 14c and 14d and spare chip 14'. The pads of these chips are thus effectively shifted left. Metal filled vias are also located over the remote end of rightwardly extending leads 64 of the pads of spare chip 14". The pads of spare chip 14" are thus effectively shifted to the right. Finally, metal filled vias 44 are placed directly over pads 36 of nondefective chips 14f, 14g and 14h resulting in normal connection and no shifting of these pads.

Figure 6C:
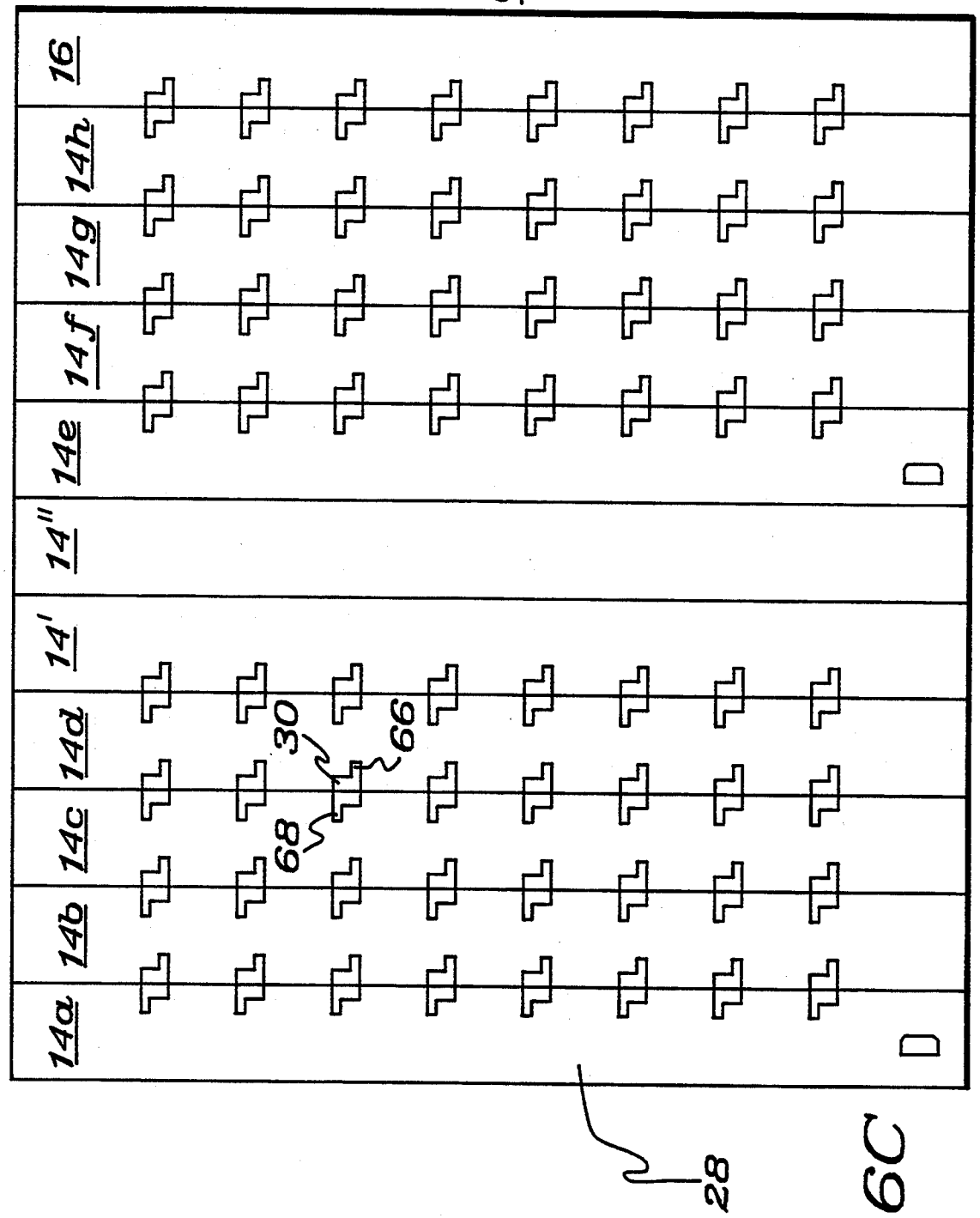
FIG. 6C depicts an interconnect landing pattern for the module section of FIG. 6A in which each interconnect landing is provided with a pair of complementary antisymmetric tabs.
Figure 6D:
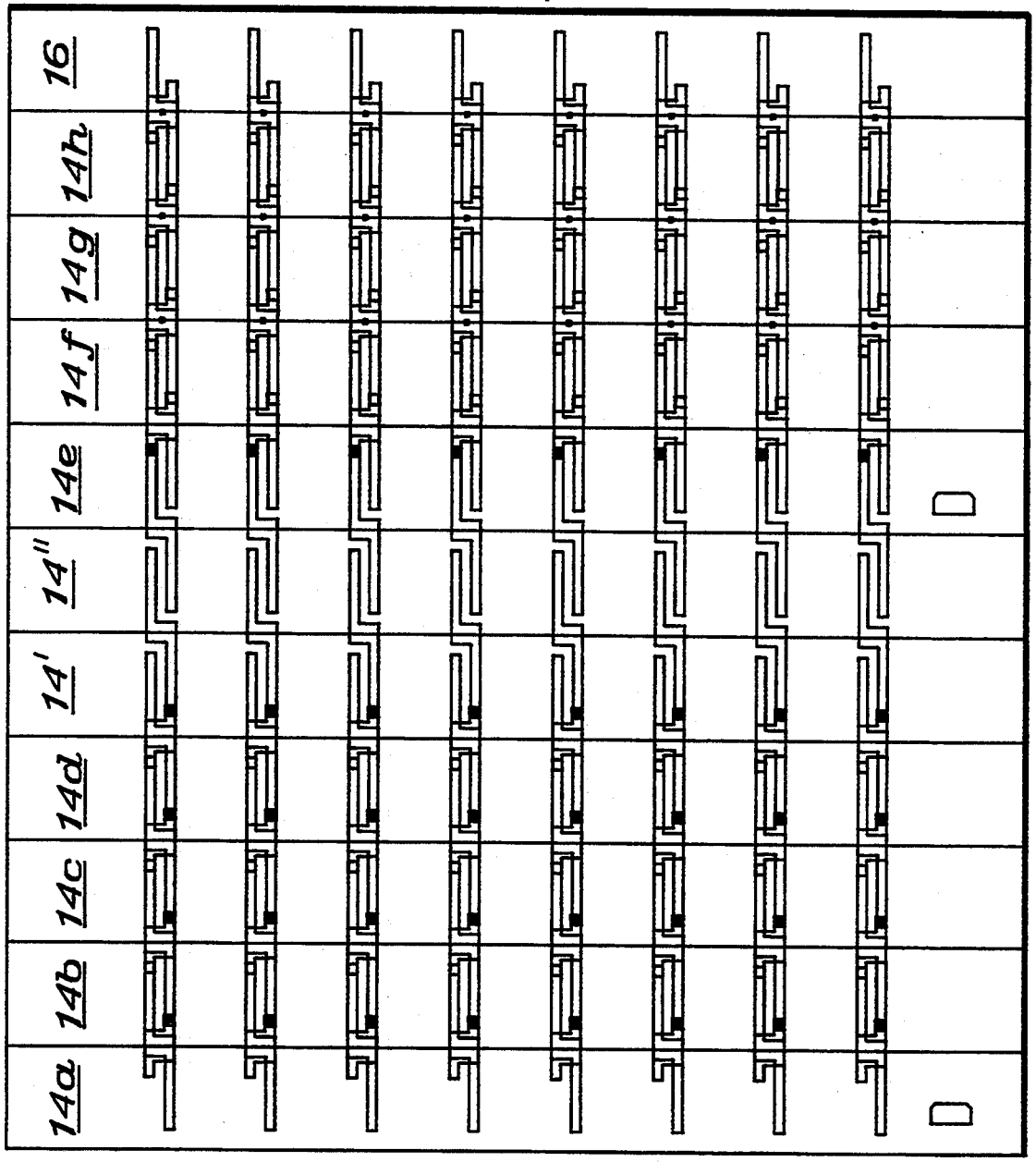
FIG. 6D schematically illustrates the superimposition of pads, vias and landings of a spare routing pattern for the module section of FIGS. 6A-6C.
Figure 6E:
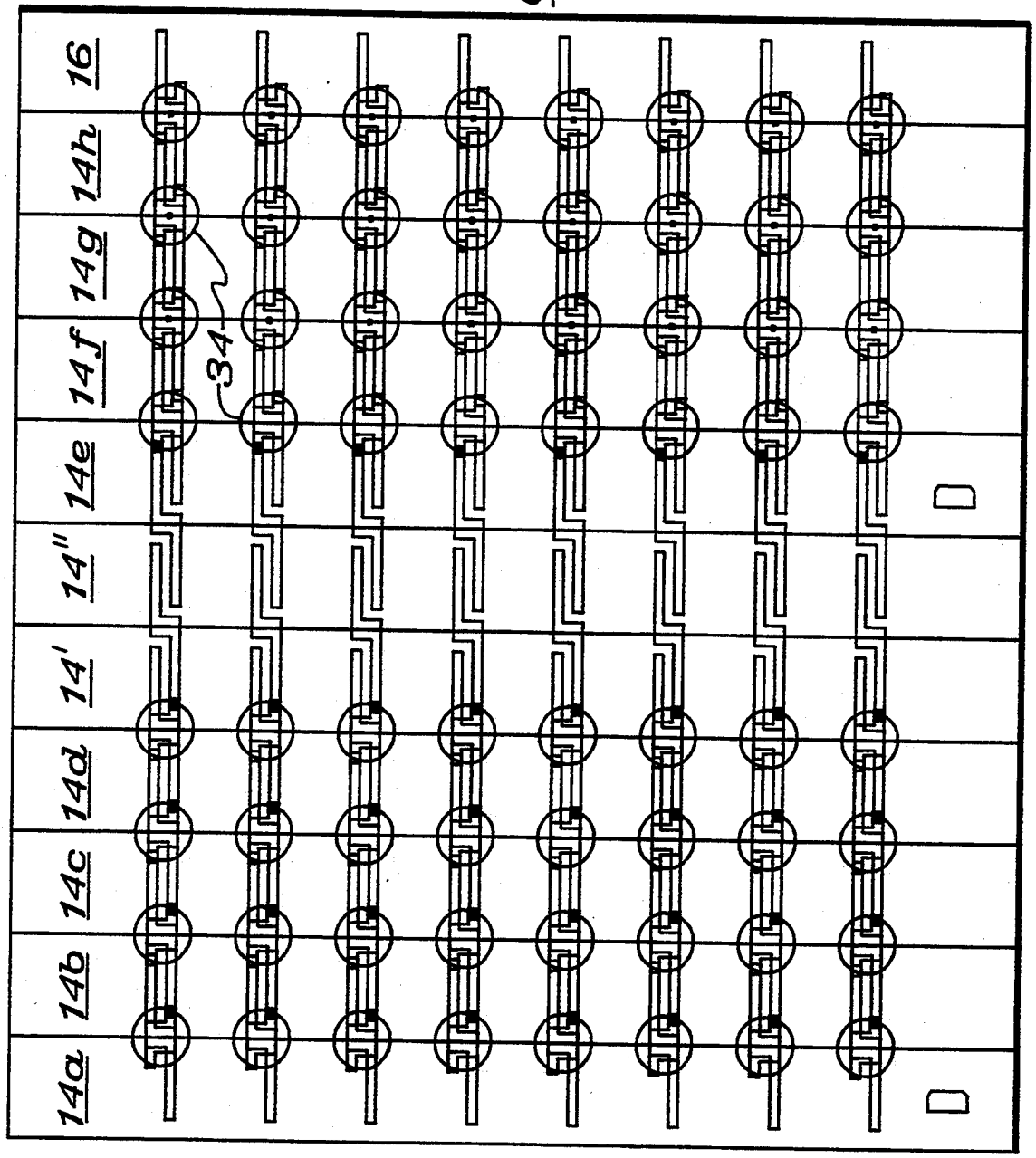
FIG. 6E schematically illustrates the application of solder bumps to the module section of FIG. 6D.

The pattern of interconnect landings for module section 60 is shown in FIG. 6C. Each metal landing 30 is provided with a pair of reverse antisymmetric tabs 66 and 68. Tab 66 extends rightwardly near the bottom of landing 30 while tab 68 extends leftwardly near the top of landing 30. Tab 66 extends from landing 30 a distance sufficient to overlie a metal filled via 44 at the remote end of a leftwardly extending lead 62 of a corresponding pad of an adjacent chip on the right. Similarly, tab 68 extends from landing 30 a distance sufficient to overlie a metal filled via 44 on the remote end of a rightwardly extending lead 64 of a corresponding pad of an adjacent chip to the left. The overlap of pad extensions, metal filled vias and landing tabs is schematically illustrated in FIG. 6D. The addition of solder bumps 34 on the interconnect landings of module section 60 is schematically illustrated in FIG. 6E. The footprint shows solder bumps located over the landings of operational chips 14a–h, even though the spare routing pattern has effectively substituted spare chip 14' for defective chip 14a and spare chip 14" for defective chip 14e. The footprint of the module section and the complementary interconnect pattern on the associated supporting substrate have remained invariant despite the presence of multiple defective chips at arbitrary locations in the module section.

The metal invariant implementations of a spare routing pattern, as illustrated in FIGS. 5 and 6, can be further extended to facilitate effective pad shifting by more than one chip length, in one or more directions. For these purposes, the metal pads of the module can be provided with integral symmetrical, antisymmetrical, or even random wiggly leads, and the metal landings formed with complementary integral tabs. In all of these cases, a desired spare routing pattern can be implemented by appropriate location of metal filled vias only, an important consideration in terms of manufacturing costs.

Via Invariant Spare Routing

Alternatively, a spare routing pattern for a module containing defective chip(s) can be implemented in a via invariant fashion. FIGS. 7A–7D illustrate a via invariant method of spare rerouting for the module section 40 of FIG. 4A, in which chip 14b has been found to be defective by pad level testing and chip 14' comprises a spare chip. On the pad level 38, a strip of insulation 70 (FIG. 7A) is applied over the pads of defective chip 14b. Insulation strip 70 can be formed by applying a coating of insulation over the entire pad surface 38 and then etching away the insulation so that only strip 70 remains. Instead of employing a continuous strip 70, each pad 36 of defective chip 14b can be covered with an individual patch of insulation.

Figure 7A:
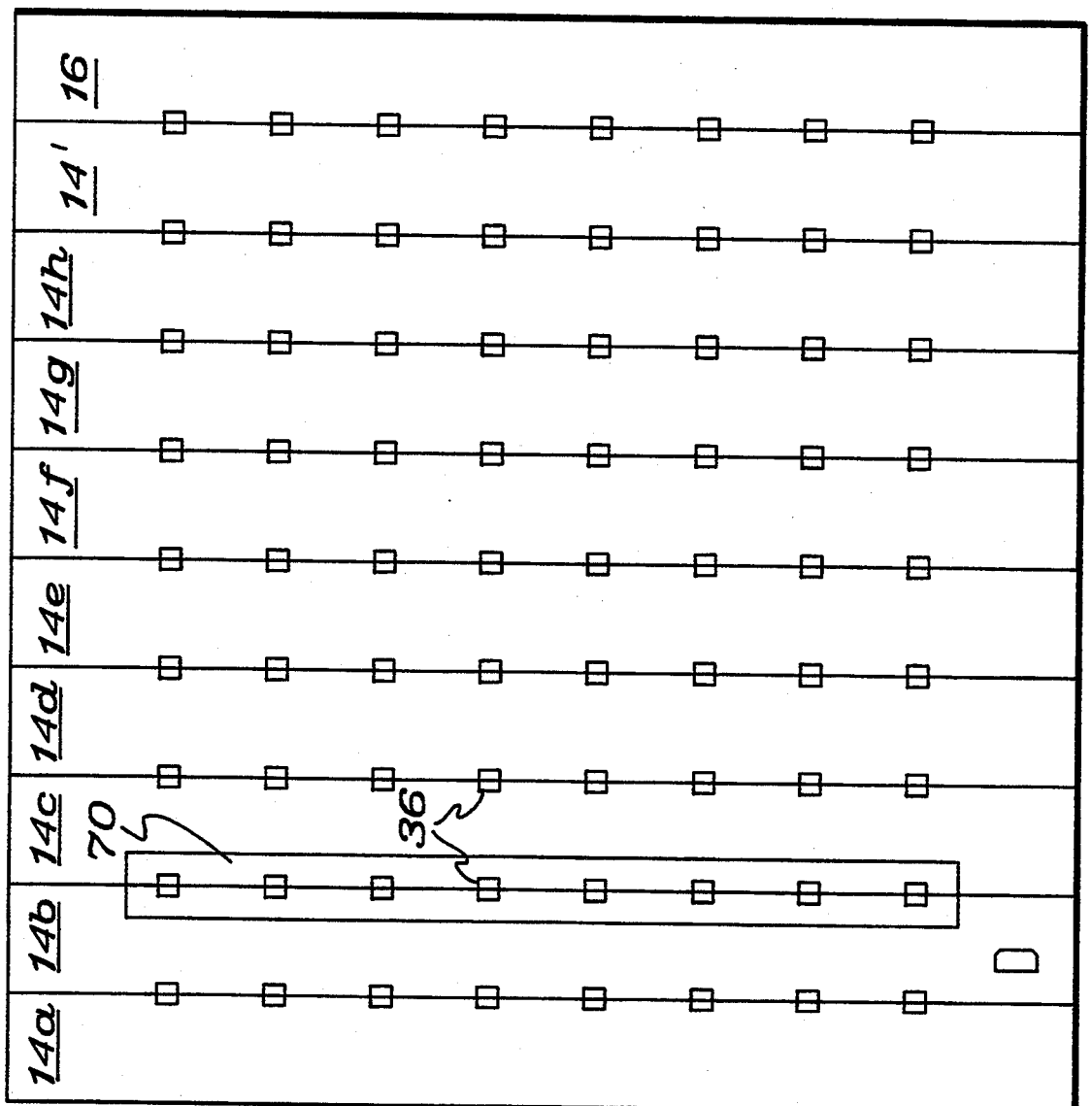
FIG. 7A illustrates the application of insulation over the pads of a defective chip in a via invariant implementation of the spare routing pattern of the present invention.
Figure 7B:
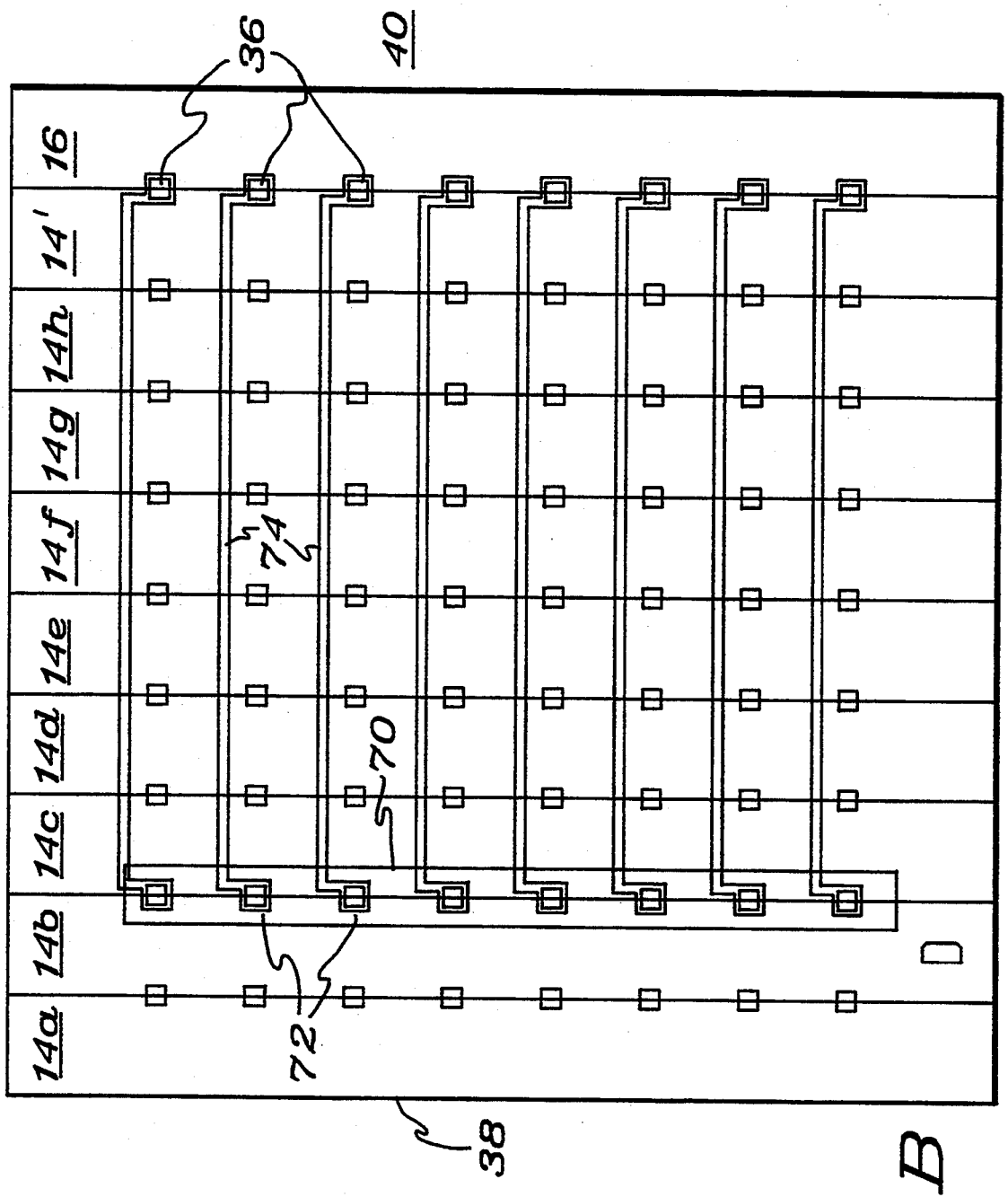
FIG. 7B illustrates the addition of new pads on top of the insulation covered original pads of the defective chip of FIG. 7A and the extension of leads from corresponding spare chip pads thereto.

As depicted in FIG. 7B, new metal pads 72 are then formed on top of insulation strip 70. Metal leads 74 connect new pads 72 to the corresponding pads 36 of spare chip 14'. New pads 72 overlie the original insulation covered pads of defective chip 14b.

Insulation is then applied over the whole pad surface 38 and new pads 72. Vias 44 (FIG. 7C) are then opened through this insulation directly above the pads of nondefective chips 14a, and 14c–14h and above new pads 72 of defective chip 14b. This via pattern is identical to the via pattern of the module section, without defects, as shown in FIG. 3B.

Figure 7C:
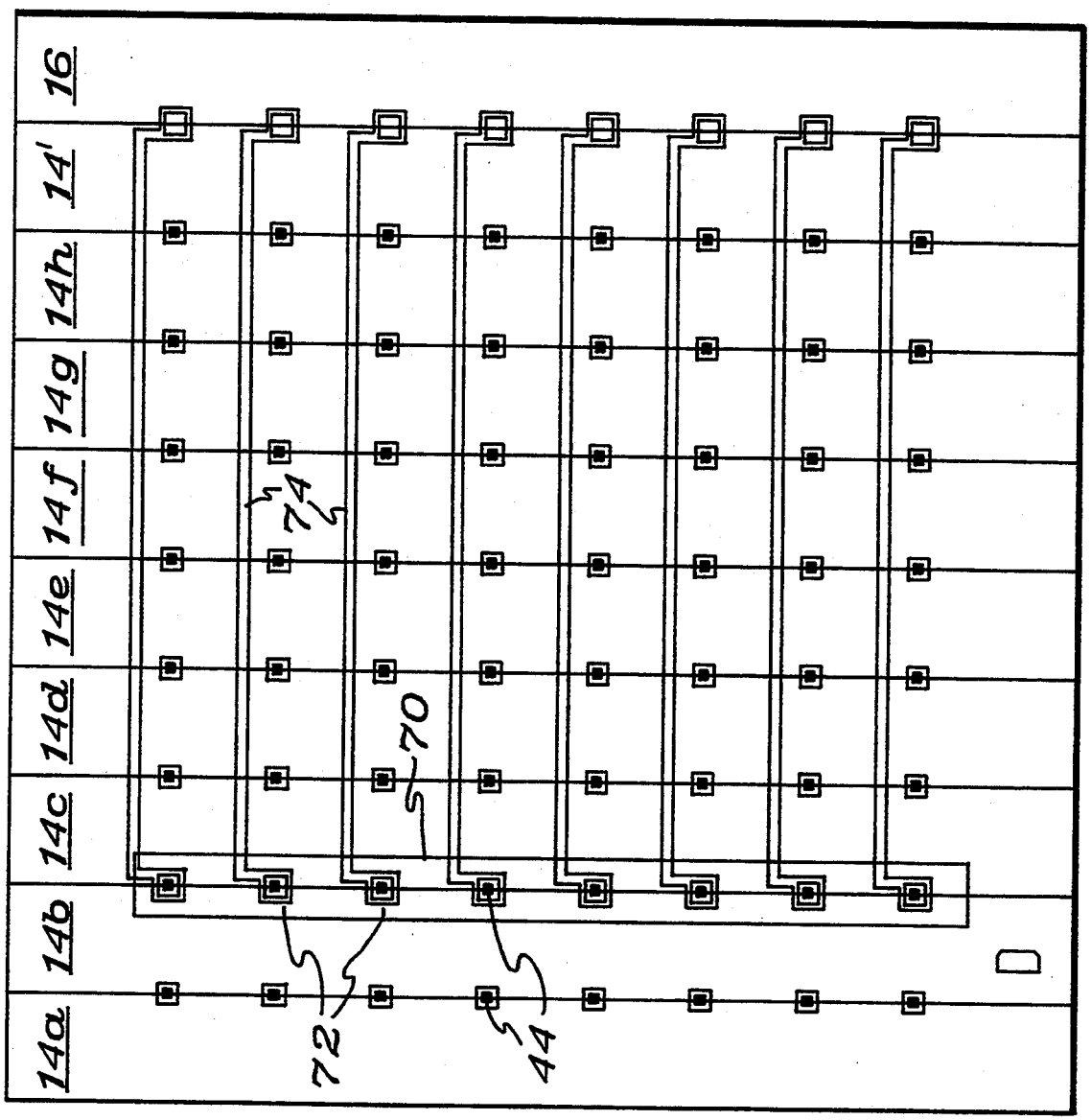
FIG. 7C illustrates the superimposition of vias on the structure of FIG. 7B.
Figure 7D:
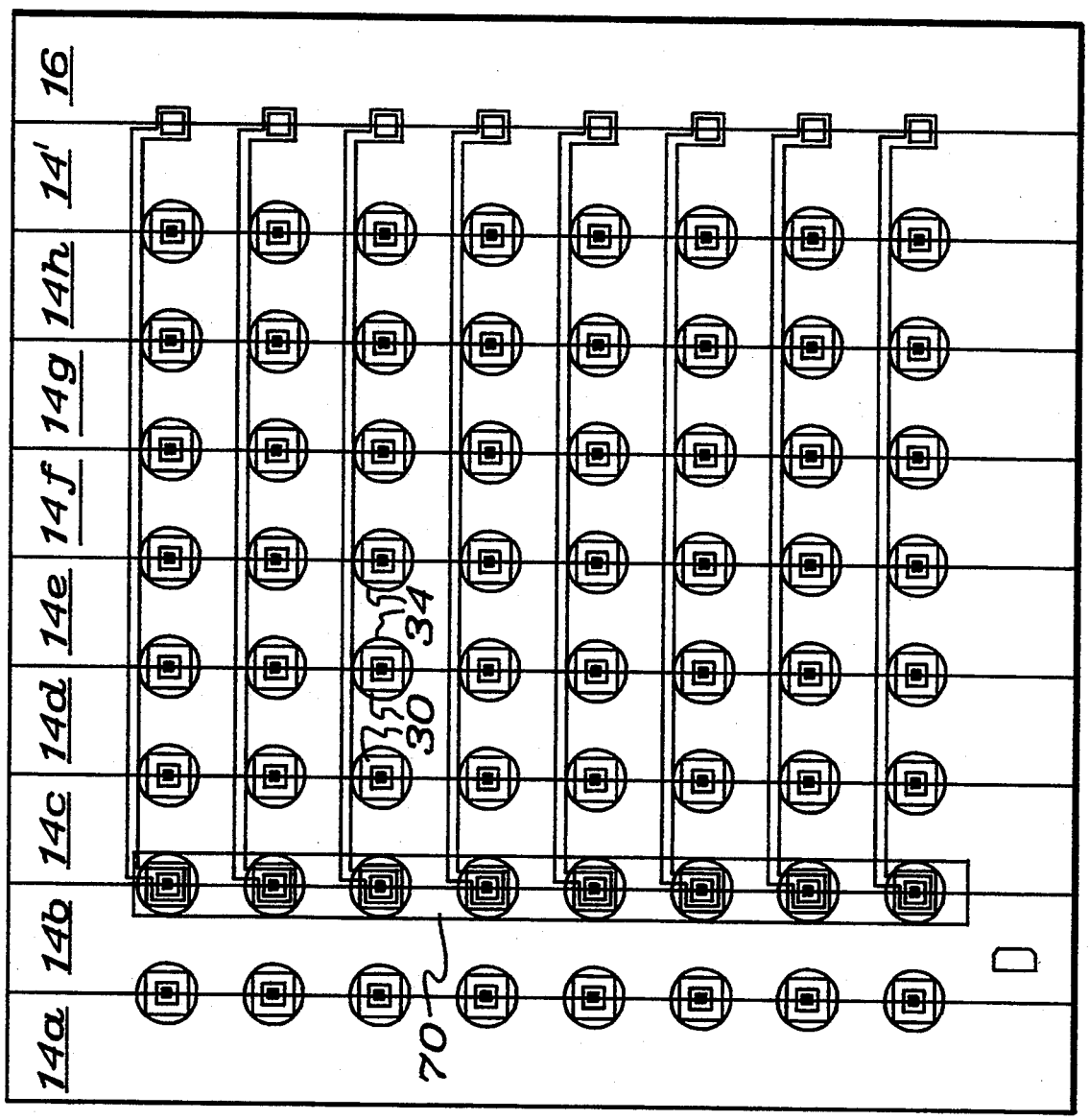
FIG. 7D schematically illustrates the superimposition of solder bumps, landings, vias and pads in a via invariant implementation of the spare routing pattern of the present invention.

In the embodiment of FIG. 7C, insulation strip 70 serves to electrically isolate defective chip 14b, while new pads 72 and associated pad level leads 74 electrically integrate spare chip 14' into the module section. Landings 30 and solder bumps 34 can then be applied, in the usual fashion, to provide the desired invariant interconnect footprint on module section 40 as illustrated in FIG. 7D. The virtue of this approach is that the via pattern is predetermined and invariant. The vias always land in the middle of the pads, and the pads and landings can have a simple shape. Insulation strip 70 may typically have a thickness of only a few microns or less and, therefore, has an insignificant effect upon the height of the overlying solder bumps.

Spare Routing Without Vias

The general sparing approach illustrated in FIGS. 7A and 7B can also be implemented with chrome dams or polysilicon or glass dams instead of metal filled vias. This implementation is depicted in FIGS. 8A–8H.

Figure 8A:
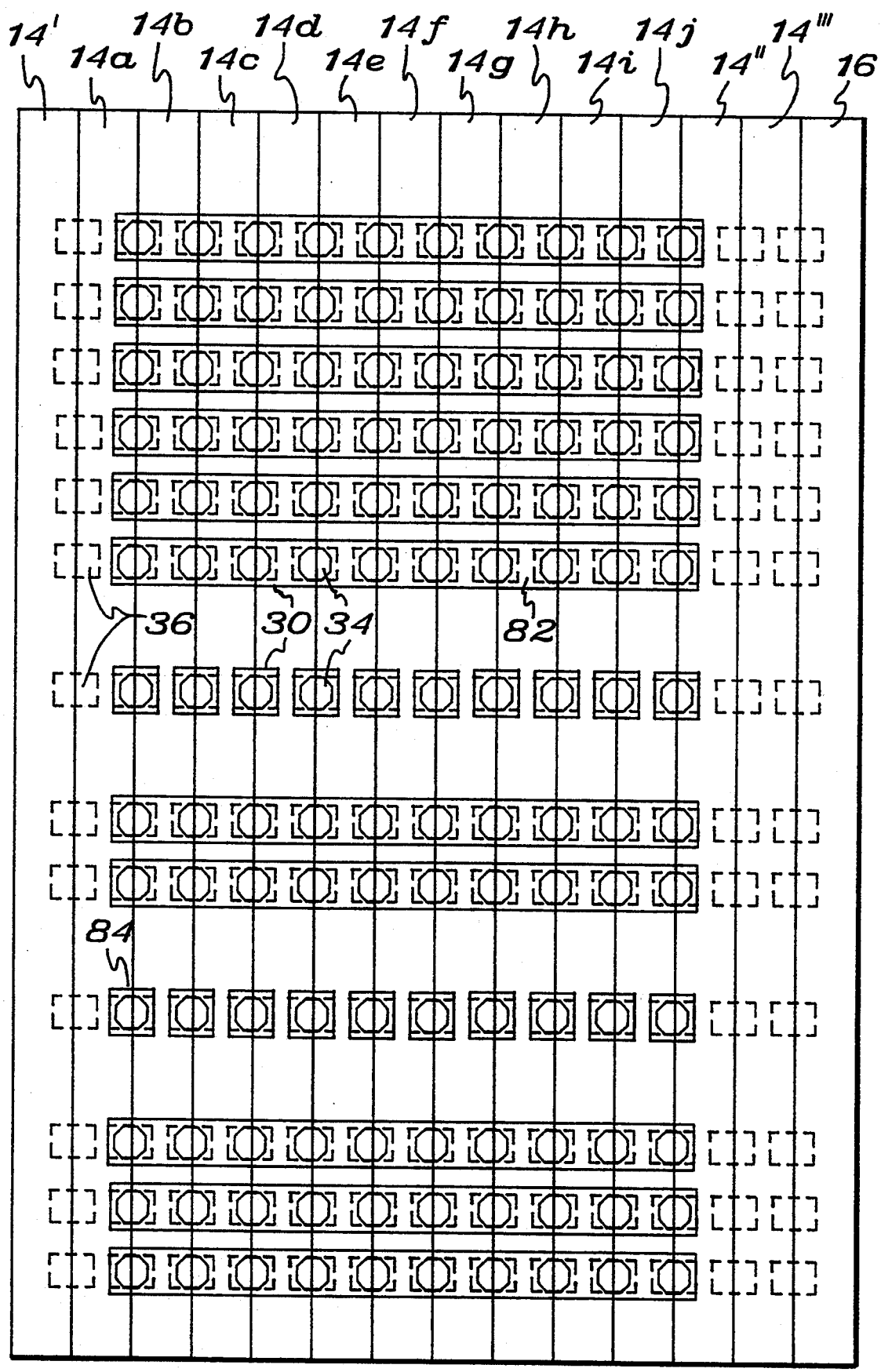
FIG. 8A schematically illustrates the superimposition of interconnect landings and pads in a good module section having both bussed and individual landings.

FIG. 8A schematically illustrates a module section 80 comprising a spare chip 14', ten operational chips 14a–14j, two additional spare chips 14" and 14'", and an end cap 16. Each chip of module section 80 has a set of pads 36, shown in phantom. Above the pads 36 of operational chips 14a–14j, landings 30 and solder bumps 34 are formed as described hereinafter. Certain rows of landings are electrically linked by buses 82, while landings, e.g. 84, in other rows are electrically isolated from each other. The latter individual landings are often used for data input/output to the individual chips of the module; timing and address signals are generally bussed. In FIG. 8A, module section 80 is shown with no defective chips, and, accordingly, the pads 36 of the spare chips are electrically isolated from the desired fixed footprint of interconnect landings.

FIG. 8B presents an enlarged plan view and FIG. 8C provides a corresponding cross-sectional view of an individual landing/single solder bump construction of FIG. 8A using a chrome dam. At the interface 86 of two neighboring chips, transfer metal 88 connects a metal pad 36 to the circuitry of one of the chips. Pad 36 can be formed on an insulating layer 81 in conventional fashion. Right over pad 36, a landing 30 composed, for example, of chrome/copper/gold or titanium/copper/gold is formed. Over the landing 30 a layer of chrome is applied. A hole is then formed through the chrome on top of landing 30 leaving a chrome dam about this hole. The chrome dam serves to constrain solder bump 34 during reflow. This chrome dam approach for forming a confined solder bump is known in the art and accordingly not described further herein.

FIG. 8D depicts an alternative construction in which a polyimide or glass dam 85 is used to form the desired solder bump 34. FIGS. 8E, 8F and 8G present views similar to FIGS. 8B, 8C and 8D respectively, for a double bump per landing construction. This construction provides the advantages of redundancy of contact and enhanced mechanical strength. The same approaches can be applied to construction of bused landings by extending the landing metal and dam forming material along the length of the bus. In all of these constructions, no insulation layer is required between the pad and the landing levels.

Figure 8H:
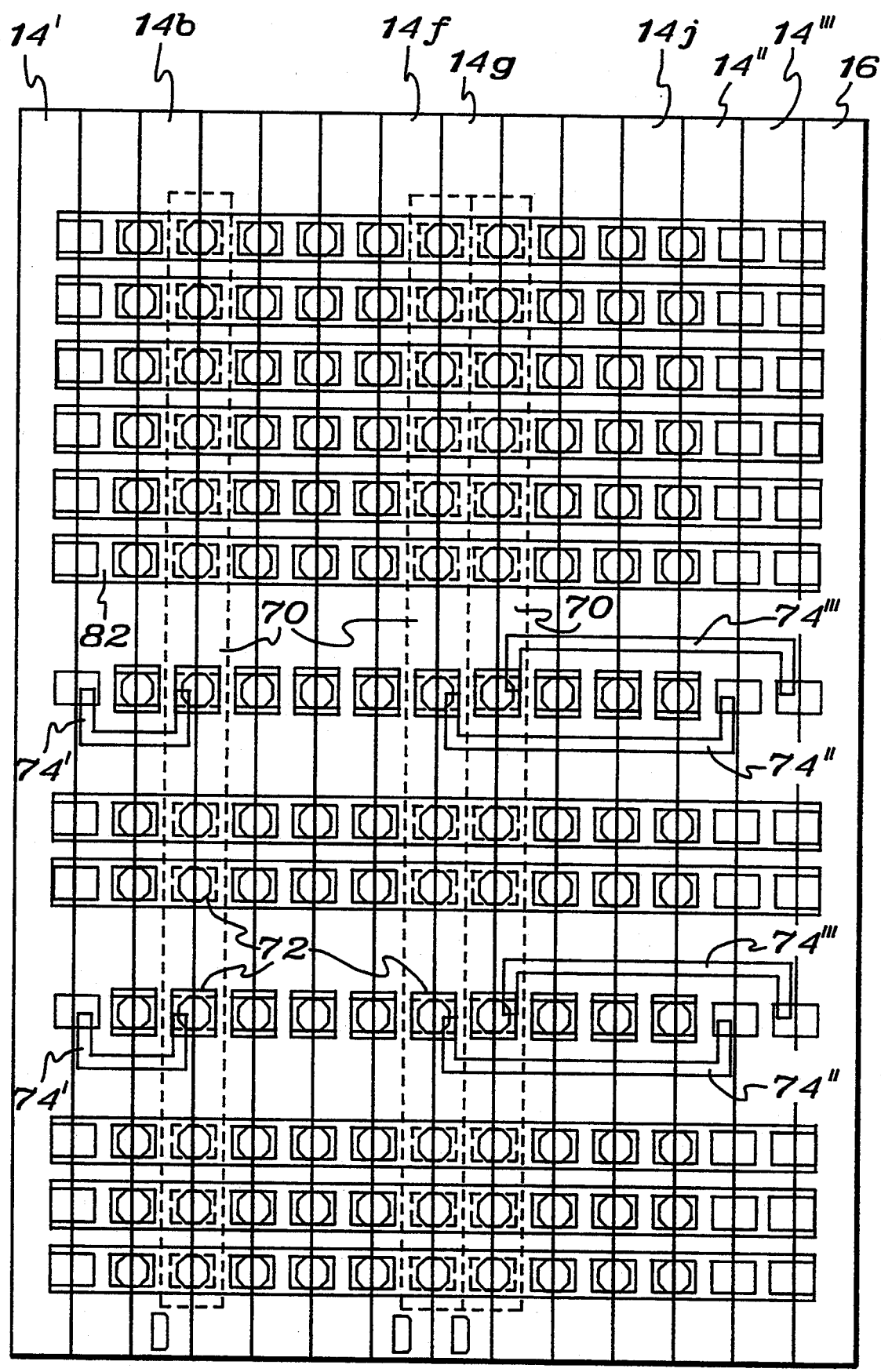
FIG. 8H illustrates a spare routing pattern for a module section similar to that of FIG. 8A, having three defective chips.

FIG. 8H illustrates the application of a spare routing pattern to module section 80 of FIG. 8A. If pad level testing indicates that chips 14b, 14f and 14g, for example, are defective, a strip of insulation 70 is formed on top of the pads of each of these defective chips. New pads 72 are then formed over the insulation covered original pads of the defective chips. Conductive leads 74' are then provided to connect the new pads 72 of defective chip 14b to the corresponding pads of spare chip 14'. Only pads of defective chip 14b normally associated with nonbussed landings are so connected to the corresponding pads of the spare chip. Similarly, conductive leads 74" connect certain new pads 72 of defective chip 14f to the corresponding pads of spare chip 14", and conductive leads 74'" conduct certain new pads 72 of defective chip 14g to the corresponding pads of spare chip 14'". Landings, both individual and bussed, and associated solder bumps can then be formed atop the pads of chips 14a-14j, as described with reference to FIGS. 8B-8G. Buses 82 are extended to corresponding pads of the spare chips but, as shown in FIG. 8H, the footprint of interconnect landings remains invariant.

Multi-Surface Applications

Figure 9A:
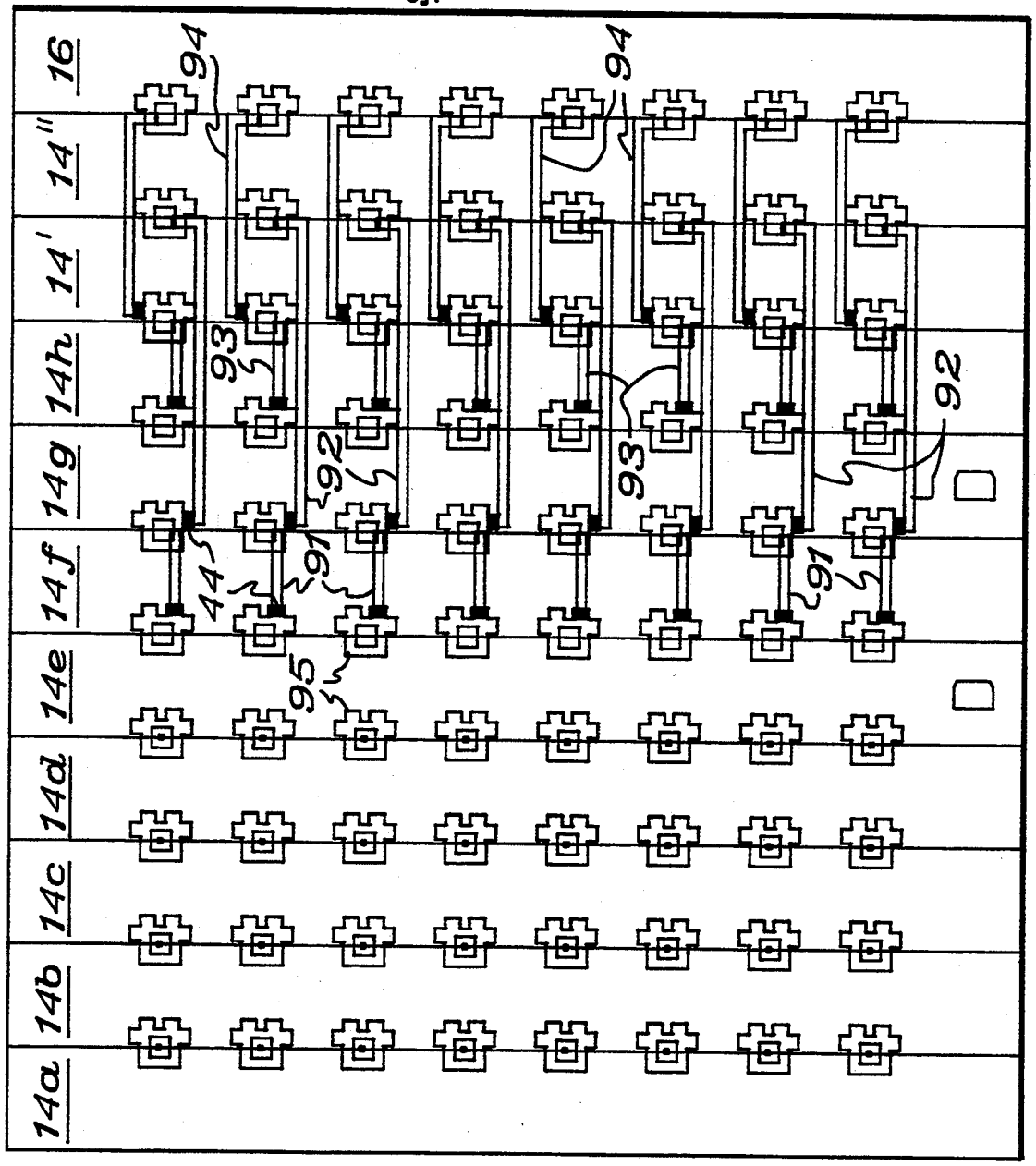
FIG. 9A illustrates a spare routing pattern for a module section having two defective chips and two spare chips.

FIG. 9A illustrates yet another example of intra-module spare routing in accordance with the principles of the present invention. Module section 90 includes operational chips 14a-14h, two spare chips 14' and 14" and end cap 16. Assuming that pad level testing identifies chips 14e and 14g as defective, personalized pad level leads 91, 92, 93 and 94, metal filled vias 44 at the remote ends of these leads, and tabbed landings 95 can be employed, as shown, to implement a desired spare routing pattern. Although landings are shown above the pads of spare chips 14' and 14", there is no via connection with these landings, and solder bumps would only be applied above the landings of operational chips 14a-14h, in accordance with the predetermined footprint of interconnect landings.

In the embodiment of FIG. 9A, and previous examples, the pad level and landing level are formed on the same face of the module. However, the pad level and landing level of a module may be on different faces. Furthermore, pads and landings may be provided on multiple faces of a module. In modules comprised, for example, of logic chips, having significant input/output, landings may be provided on three or four surfaces of the module for bonding with a corresponding number of substrates (e.g. separate carriers or other modules).

Figure 9B:
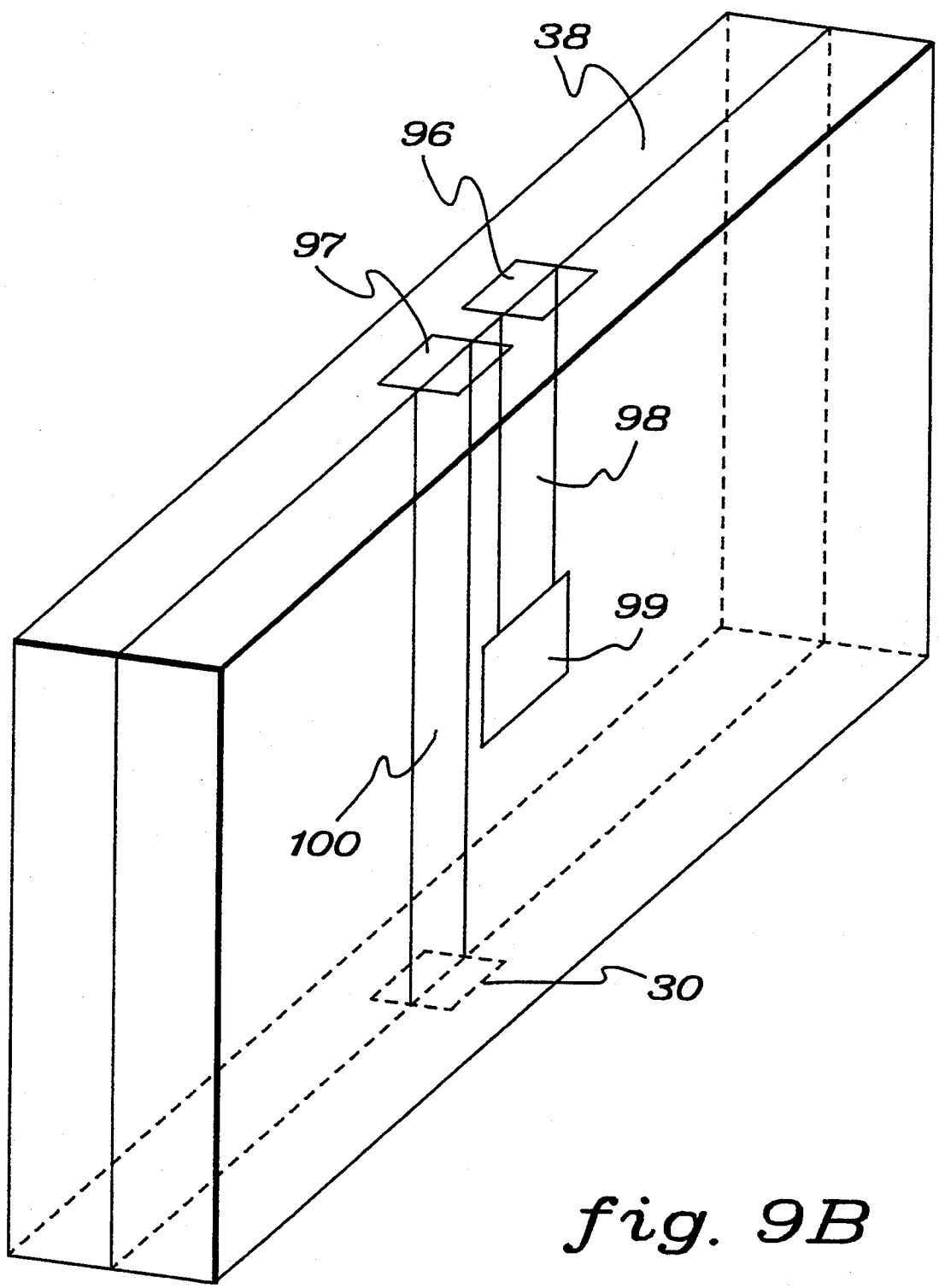
FIG. 9B illustrates a basic chip wiring approach employing a pair of pads on a first surface of the module and an associated landing on a different face of the module.
Figure 9C:
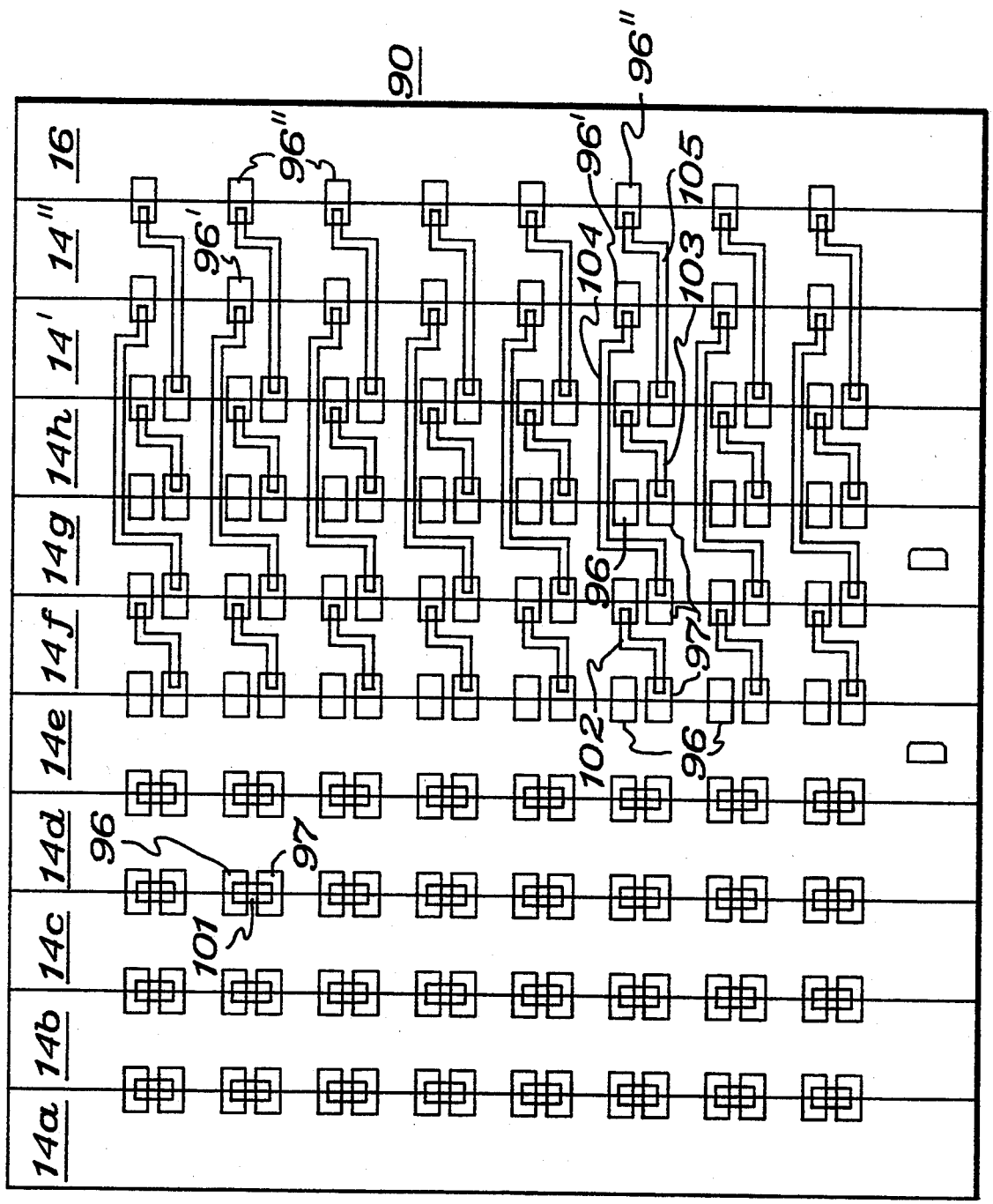
FIG. 9C is a pad level view of a module section employing the chip wiring approach of FIG. 9B and implementing the same spare routing pattern as FIG. 9A.

FIGS. 9B and 9C illustrate how the spare routing pattern of FIG. 9A might be implemented when pads are provided on one surface of a module and landings on another surface. A pair of associated spaced apart pads 96 and 97 (FIG. 9B) are provided on a first (e.g. top) surface 38 of the module. Pad 96 is connected by transfer metal 98 to the circuitry 99 of a chip. Pad 97 is connected by transfer metal 100 to a landing 30 on an opposite face of the module.

FIG. 9C provides a pad level view of a modular section 90 constructed in accordance with the basic approach of FIG. 9B. Spare chips 14' and 14" are provided with only individual spare pads 96' and 96", respectively. Spare pads 96' and 96" connect to the internal circuitry of the spare chips. Since no landings are provided for the spare chips, no pads comparable to pads 97 of the operational chips are needed by the spare chips. The pads 96 and 97 of each pad pair of nondefective chips 14a-14d (not involved in the spare routing) are interconnected by a bridging lead 101. Pads 96 of defective chips 14e and 14g are left electrically isolated. Pads 97 of defective chips 14e and 14g are connected by conductive leads 102 and 103, respectively, to corresponding pads 96 of adjacent nondefective chips 14f and 14h, respectively. Similarly, the pads 97 of nondefective chips 14f and 14h are connected by conductive leads 104 and 105 at the pad level to corresponding spare pads 96' and 96" of spare chips 14' and 14" respectively. In this fashion, the desired spare routing pattern can be implemented purely through the application of metallization at the pad level, while the footprint of interconnect landings is maintained on a different surface of the module.

Spare Routing for Partially Defective Chips

Figure 10A:
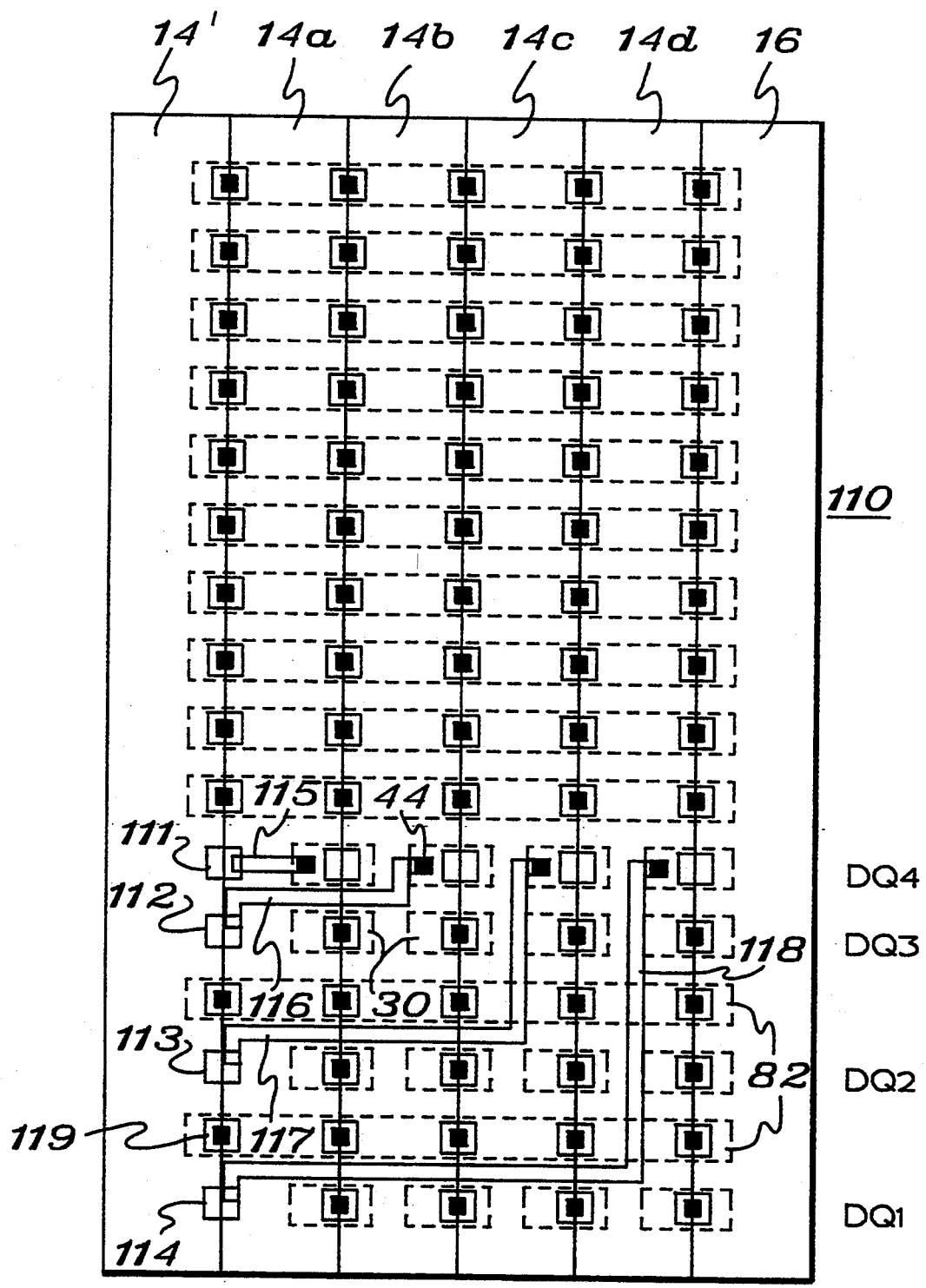
FIG. 10A illustrates a first spare routing pattern for a module section having one spare chip and four partially defective chips.

The spare routing method of the present invention can also be advantageously applied to modules containing partially defective chips. FIG. 10A depicts a module section 110 containing a spare chip 14', four operational chips 14a-14d and an end cap 16. Certain rows of the module labeled DQ1, DQ2, DQ3, and DQ4 contain individual landings 30 which provide data I/O. Landings in the remaining rows of module section 110 are bussed, e.g. for address and timing signals. Pad level testing of module section 10a might indicate that each of chips 14a-14d is partially defective, e.g. in row DQ4. In such a situation, pads 111, 112, 113 and 114 of spare chip 14' can be connected by pad level leads 115, 116, 117 and 118, respectively, and metal filled vias 44 to landings normally associated with functionally equivalent pads in defective row DQ4. The insulation layer through which metal filled vias 44 pass, separates the pad level from the landing level in this module allowing pad level leads, e.g. 117 and 118 to pass under landing level buses 82. Buses 82 are extended to facilitate electrical connection with spatially corresponding pads 119 of spare chip 14' through associated metal filled vias. The interconnect footprint of module 110 is maintained by providing solder bumps only above the landings of chips 14a-14d.

Figure 10B:
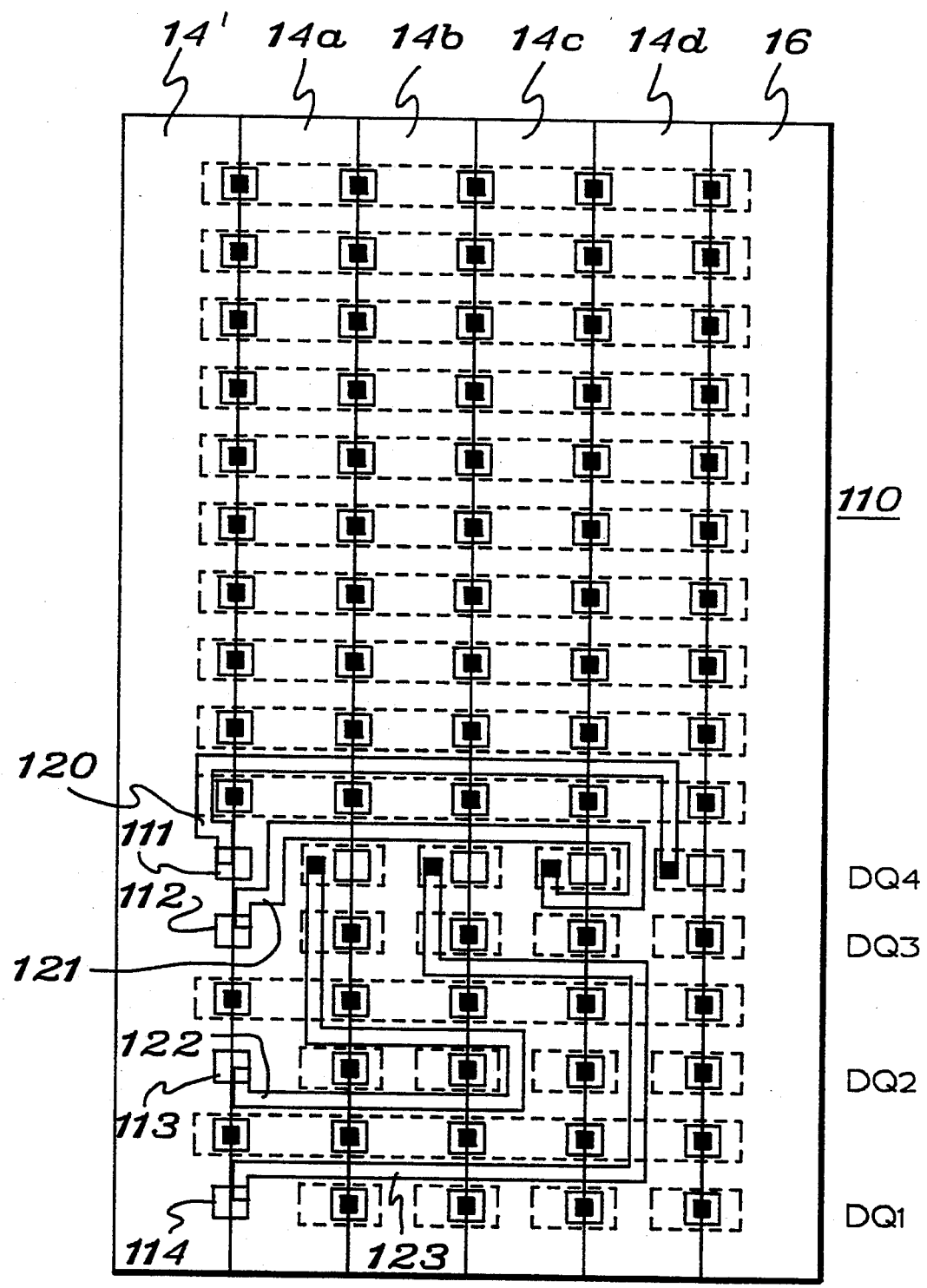
FIG. 10B illustrates a second spare routing pattern for the module section of FIG. 10A in which the leads of the spare routing pattern are constrained to be of approximately equal length.

FIG. 10B provides an alternate spare routing pattern for module section 110 wherein the pad level leads 120, 121, 122, and 123 connecting spare chip pads 111, 112, 113, and 114, respectively, to landings normally associated with the defective pads in row DQ4, are constrained to be of substantially equal length.

Figure 10C:
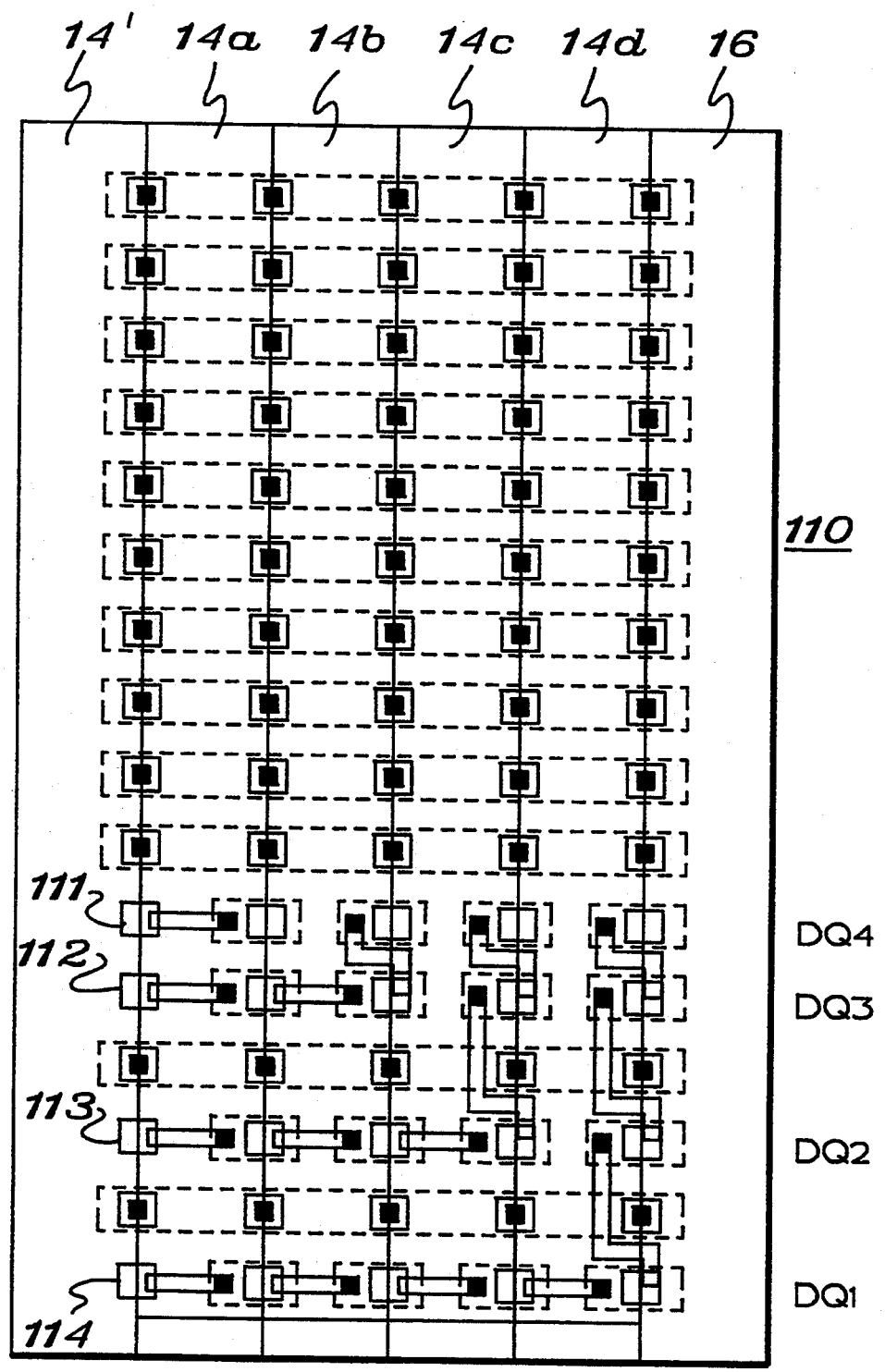
FIG. 10C illustrates a third spare routing pattern for the module section of FIG. 10A in which the individual leads of the spare routing pattern are constrained to be of minimum length.

FIG. 10C shows yet another alternative spare routing pattern for module section 110. In this embodiment, the individual pad level leads originating with pads 111, 112, 113, and 114 of spare chip 14' are designed to be of minimum length.

Spare Routing on an End Face

FIG. 11 presents an exploded view of a module 130 having a fixed pattern of interconnect landings 30 on an end face 132 of the module. This arrangement provides a number of advantages as indicated in the following description.

Module 130 includes eight operational chips 14a–14h, sandwiched between a spare chip 14' and a special end cap 134. End cap 134 includes an active semiconductor layer 135 and alternating layers of insulation (144, 148 and 152) and metallization (142 and 143, 36T and 36B, and 30), as described hereinafter. Each chip of module 130 is provided with a first set of chip connection pads 136 at a top side face 138 of the module. In known fashion, transfer metal or wiring 140 connects bussed and individual pads 136 on top face 138 to a first array of corresponding pads 142 on insulating layer 144 of end cap 134. Various methods for conductively connecting pads on a side face of a module to corresponding pads on an end face are described in commonly assigned, co-pending U.S. patent application Ser. No. 07/768,137 entitled "Multichip Integrated Circuit Packages and Systems", filed Sep. 30, 1991, which application is incorporated herein by reference.

Optionally, as most clearly seen with reference to chip 14e shown removed from module 130, a second redundant set of chip connection pads 137 can be provided on a bottom side face 139 of module 130 for interconnection by appropriate transfer metal to a second array of pads 143 on insulating layer 144. The redundant chip connection pads and associated wiring on the bottom face are used to compensate for defects (e.g. breaks or shorts) in wiring 140 running along the top face of module 130, as more fully described subsequently.

Metal filled vias 146 extending through insulating layer 148 of end cap 134 conductively connect arrays of pads 142 and 143 to corresponding sets of pads 36T and 36B, respectively, at a first pad level 150 of module 130. A pad 36T is provided for each pad 142 and a pad 36B is provided for each pad 143.

On the access surface 132 of module 130, landings 30 are arranged in a predetermined pattern or footprint. In the example shown, the landings 30 lie in a rectangular peripheral pattern. Other patterns are, of course, possible. The number of landings 30 in the rectangular pattern is equal to the number of pads 36T less those pads 36' conductively connected with non-bussed pads 136' of spare chip 14'.

If pad level testing indicates that there are no defects in operational chips 14a–14h nor in the transfer metal pattern 140 originating on the top surface 138 of module 130, individual pads 36T (excluding spare chip pads 36') are conductively connected to corresponding landings 30 normally associated therewith. Should pad level testing reveal that one of the operational chips is defective, a spare routing pattern is applied between the first pad level 150 and access surface 132 to conductively connect pads 36' associated with spare chip 14' to the footprint of landings 30. The spare routing pattern can be implemented, for example, by selective application of conductive leads, and metal filled vias extending through insulation 152, as earlier described. Further, if a fault occurs in the wiring 140 leading to a particular pad 36T, a pad 36B connected to the corresponding redundant chip connection pad 137, can be connected to the appropriate landing on access surface 132. Thus the structure of module 130 facilitates not only substitution of a spare chip for a defective chip but also replacement of defective chip connection wiring, without requiring any variation in the footprint of the module.

The special end cap 134 may advantageously include an active semiconductor layer 135, e.g. silicon, incorporating integrated circuitry, e.g. output drivers 154 and receivers 156, normally found at the next higher level of assembly. Although only a single output driver 154 and single receiver 156 are shown in FIG. 11, multiple such devices, as well as other integrated circuits, e.g. error correction code circuitry, can readily be formed in the active semiconductor layer 135 of end cap 134, using well known techniques.

Output driver 154 is of conventional design. The input terminal 158 of driver 154 typically receives a signal output from a chip of module 130. This signal can be transmitted from an appropriate landing 30 on end face 132 to a special landing 159 which, in turn, is conductively connected through associated pads and metal filled vias to input terminal 158. Likewise, the output of driver 154 can be transferred from output terminal 160 through appropriate metal filled vias and pads to special landing 161, and from there to an appropriate output landing 30.

Similarly, receiver 156, of conventional design, has its input terminal 162 conductively connected by appropriate metal filled vias and pads to special landing 163 and its output terminal 164 conductively connected to special landing 165. Landings 163 and 165 can be conductively connected to appropriate respective landings 30 such that an input signal originating outside of the module is made to pass through receiver 156 and then to an appropriate chip of module 130.

As indicated, the special landings 159 and 161 associated with output driver 154 and special landings 163 and 165 associated with receiver 156 are preferably conductively connected to appropriate landings 30 and, accordingly, no solder bumps are normally provided on these special landings. When multiple output drivers 154 and/or receivers 156 are provided in active semiconductor layer 135, the power supply and ground connections of these devices can be bussed together, respectively. Extra output drivers and/or receivers can be provided in active semiconductor layer 135 as potential replacements for normally used devices. Should pad level testing indicate that a normally used output driver or receiver is defective, the extra device can be substituted therefor by applying a spare routing pattern between appropriate pads at pad level 150 and the special landings on access surface 132, in accordance with the principles and techniques of the present invention as earlier described herein.

Rather than an active semiconductor material, special end cap 134 may be formed from an inactive material, such as a ceramic, e.g. aluminum nitride, or an organic material, e.g. FR4. Placement of the pattern of interconnect landings 30 on end cap 134 affords the advantage of uniform expansivity in all directions at the access surface of the module. By judicious selection of the material comprising special end cap 134, the coefficient of expansion at the access surface of the module can be matched to that of the mating substrate thereby reducing thermal fatiguing of the interconnecting solder bumps.

Although, in FIG. 11, the chip connection wiring is shown on the top and bottom side faces of the module, such wiring may be provided on all four side faces or any subcombination thereof. Similarly, the interconnect landings can be provided on either one or both end faces of the module, and/or on any side face of the module.

Conclusion

The present invention, as exemplified by the embodiments described herein, advances the state of the art by affording a method for replacing defective chips in a multichip module of an electronic package without dismantling the module or varying the module's interconnect footprint. The fixed footprint and complementary interconnect pattern of a supporting substrate are maintained invariant despite random combinations of defective chips. Existing low cost fabrication processes can be employed to implement the invention. A commercially practical, high percent module yield is achievable with the intra-module sparing techniques of the present invention.

While various embodiments of the invention have been described and depicted herein,, many modifications, substitutions, additions and the like may be effected by those skilled in the art. For example, the method of the present invention can be advantageously applied to modules containing any number of chips and various numbers of spare chips disbursed between operating chips. Further, multiple alternate layers of insulation and metallization can be used to selectively interconnect pads on the first pad level to landings on the bonding surface of the module. Techniques other than bump bonding may be used to interconnect the module landings to terminals of the substrate interconnect pattern. The substrate may comprise another module having complementary interconnect pattern terminals on an access surface thereof. Other variations will occur to those skilled in this art. Accordingly, it is intended by the appended claims to cover all such modifications and changes as fall within the true spirit and scope of the invention.

We claim:

1. A method of fabricating a multichip module for a high density electronic package such that the module maintains a predetermined pattern of interconnect landings on an access surface thereof while accommodating the possible presence of a defective chip in the module, comprising the steps of:

laminating together multiple chips, including a spare chip, to form a module;

providing a set of chip circuitry connecting pads for each chip of the module at a first pad level of the module;

testing the module to identify a defective chip in the module;

providing a predetermined pattern of interconnect landings on an access surface of the module, each landing of said pattern being normally associated with a respective pad of a non-spare chip, and conductively connecting each landing to the respective pad normally associated therewith if said testing identifies no defective chip in the module; and if said testing identifies a defective chip in the module, forming a spare routing pattern on the module itself which electrically isolates a pad of the defective chip from the predetermined pattern of landings and electrically connects a corresponding pad of the spare chip to the predetermined pattern of landings.

2. The method of claim 1 wherein the step of forming the spare routing pattern comprises conductively connecting a landing normally associated with the pad of the defective chip to a corresponding pad of a non-defective chip.

3. The method of claim 2 wherein said non-defective chip comprises said spare chip.

4. The method of claim 2 wherein said non-defective chip comprises a non-spare chip; and the step of forming the spare routing pattern further comprises the step of conductively connecting the corresponding pad of the spare chip to a landing normally associated with a corresponding pad of a non-defective non-spare chip.

5. The method of claim 2 wherein corresponding pads of different chips are one of: (a) spatially aligned, and (b) functionally equivalent.

6. The method of claim 5 further comprising the step of providing insulation between the first pad level and the access surface of the module; and wherein the step of forming the spare routing pattern comprises conductively interconnecting the landing normally associated with the pad of the defective chip to the corresponding pad of a non-defective chip with a metal filled via extending through said insulation.

7. The method of claim 6 wherein said step of forming the spare routing pattern further comprises:

providing a first lead at the first pad level extending from the corresponding pad of the non-defective chip to the vicinity of said pad of the defective chip;

providing a first tab on the access surface extending from the landing normally associated with said pad of the defective chip; and interconnecting the first lead to the first tab with the metal filled via.

8. The method of claim 7 further comprising the steps of:

forming the first lead integral with the corresponding pad of the non-defective chip; and forming the first tab integral with the landing normally associated with said pad of the defective chip.

9. The method of claim 8 further comprising the steps of:

providing the corresponding pad of the non-defective chip with a second integral lead extending in an opposite direction to the first lead; and providing the landing normally associated with said pad of the defective chip with a second integral tab extending in an opposite direction to the first tab.

10. The method of claim 9 wherein said first and second leads are antisymmetrical; and said first and second tabs are reverse antisymmetrical.

11. The method of claim 5 wherein the step of forming the spare routing pattern comprises:

selectively covering the pad of the defective chip with insulation;

extending a lead from the corresponding pad of the spare chip to a site on top of said insulation covered pad;

forming a new pad at said site; and conductively connecting the new pad to a landing normally associated with the insulation covered pad of the defective chip.

12. The method of claim 11 wherein said new pad is conductively connected with a metal filled via to the landing normally associated with said insulation covered pad of the defective chip.

13. The method of claim 11 wherein the landing normally associated with said insulation covered pad of the defective chip is formed directly atop the new pad; and further comprising the step of forming a solder bump atop said landing with a reflow dam.

14. The method of claim 13 wherein said reflow dam comprises one of chrome, polyimide, and glass.

15. The method of claim 14 wherein a plurality of solder bumps are formed atop said landing with said reflow dam.

16. The method of claim 6 wherein the step of forming the spare routing pattern further comprises extending a lead at the first pad level from the corresponding pad of the spare chip to the vicinity of said pad of the defective chip; and employing the metal filled via to interconnect the lead to the landing normally associated with the pad of the defective chip.

17. The method of claim 16 further comprising the steps of:
providing a landing bus on the access surface of the module, said landing bus interconnecting landings normally associated with spatially aligned pads of non-spare chips; and
extending the landing bus to a landing conductively connected to a spatially aligned pad of the spare chip.

18. The method of claim 17 further comprising the step of forming solder bumps atop only those bussed landings which are normally associated with pads of non-spare chips.

19. The method of claim 18 wherein said lead extends from the pad of the spare chip to the vicinity of a non-spatially aligned pad of the defective chip and crosses under an extended landing bus on the access surface of the module.

20. The method of claim 5 wherein said first pad level and said access surface are located on different faces of said module.

21. The method of claim 20 wherein the set of pads of each non-spare chip includes a pair of spaced apart associated pads, a first pad of said pair being conductively connected to circuitry of the chip, a second pad of the pair being conductively connected to a particular landing of said predetermined pattern, said first and second pads of the pair being normally interconnected; and
wherein said step of forming a spare routing pattern comprises:
electrically isolating a first pad of a pad pair of a defective chip; and
conductively connecting the second pad of said pad pair of the defective chip to one of: (a) a first pad of a corresponding pad pair of a non-defective non-spare chip and (b) a corresponding pad of the spare chip, at the first pad level.

22. The method of claim 1 further comprising the step of determining the number of spare chips to be included in the module based on a binomial distribution and expected chip defect level.

23. The method of claim 22 wherein the number of spare chips included in the module is determined in accordance with the following equation:

$$\sum_{0}^{m} \frac{n! \, Pf^m (1 - Pf)^{n-m}}{m!(n-m)!}$$

where:
n = Total number of chips in the module;
m = Number of spare chips;
n-m = Desired number of good chips in the module; and
Pf = Average probability of chip failure in the module assembly.

24. The method of claim 1 wherein said testing step comprises testing the module at said first pad level to identify a defective chip in the module.

25. The method of claim 2 wherein said access surface comprises a side face of the module.

26. The method of claim 2 further comprising the step of providing an end cap on an end of said module; and wherein said access surface comprises an end face of said end cap.

27. The method of claim 26 wherein said spare routing pattern is applied to said end cap.

28. The method of claim 27 further comprising the step of:
forming the end cap from a material having a coefficient of expansion which substantially corresponds to a coefficient of expansion of a substrate to be bonded to the pattern of landings on the access surface of the module.

29. The method of claim 28 wherein the end cap is formed from a material comprising one of: ceramic material and organic material.

30. The method of claim 27 further comprising the step of including an active semiconductor layer in said end cap, said active semiconductor layer including a first integrated circuit device normally conductively connected to a chip of the module.

31. The method of claim 30 further comprising the steps of:
providing a spare integrated circuit device in said active semiconductor layer; and
conductively connecting the spare integrated circuit device to the chip normally connected to the first integrated circuit device, when testing indicates that the first integrated circuit device is defective.

32. The method of claim 27 wherein said first pad level is on the end cap of the module; and further comprising the step of providing a redundant set of circuitry connecting pads for each chip of the module at said first pad level.

33. The method of claim 32 further comprising the step of conductively connecting a pad of the redundant set to an interconnect landing when wiring extending from the pad normally associated with said landing to a chip of the module is found to be defective.

34. The method of claim 1 further comprising the step of bump bonding the interconnect landings of the module to complementary terminals of a fixed metal pattern on a supporting substrate.

35. An electronic package fabricated in accordance with the improved method of claim 34.

36. A module fabricated in accordance with the method of any one of claims 1, 2, 6, 7, 9, 11, 21, 27, 28, 30, 31 or 32.

37. A method of repairing a multichip module containing at least one spare chip and having an access surface on which a predetermined pattern of interconnect landings is applied for conductive connection to complementary terminals of a substrate interconnect pattern, comprising the steps of:

identifying a defective chip in the module; and forming a spare routing pattern on the module itself which electrically isolates the defective chip and electrically accesses the spare chip without altering the predetermined pattern of interconnect landings and the substrate interconnect pattern.

38. The method of claim 37 wherein the step of forming a spare routing pattern comprises electrically isolating an electrical connection pad of the defective chip from the predetermined pattern of interconnect landings, and conductively connecting a corresponding electrical connection pad of the spare chip to the predetermined pattern of interconnect landings.

39. The method of claim 38 wherein the step of forming a spare routing pattern comprises conductively connecting a landing normally associated with the pad of the defective chip to a corresponding pad of a non-defective chip.

40. A multichip module for a high density electronic package comprising:

a plurality of stacked laminated layers, each layer including one or more semiconductor chips, at least one chip being defective and at least one other chip being a spare;

chip connection pads at a first level of said module for providing electrical connection to each chip of the module;

a predetermined pattern of metal interconnect landings on an access surface of the module, each landing of the predetermined pattern being normally associated with a respective pad of a non-spare chip of the module; and spare routing means formed on said module itself, said spare routing means being between said chip connection pads and said predetermined pattern of metal interconnect landings for electrically substituting a non-defective chip for the defective chip and electrically connecting said spare to the predetermined pattern of metal interconnect landings.

41. The module of claim 40 wherein said spare routing means comprises conductive connecting means for connecting a landing normally associated with a pad of the defective chip to a corresponding pad of a non-defective chip, and connecting a corresponding pad of the spare chip to a landing in said predetermined pattern.

42. The module of claim 41 wherein said conductive connecting means comprises:

a lead at the first level extending from the corresponding pad of the non-defective chip to a terminus in the vicinity of the pad of the defective chip; insulation over said first level; and a metal filled via in said insulation above the terminus off the lead, said metal filled via being conductively connected to the landing normally associated with the pad of the defective chip.

43. The module of claim 41 in combination with a supporting substrate having a fixed interconnect pattern; and means for conductively connecting the interconnect landings of the module to complementary terminals of the fixed interconnect pattern of the supporting substrate.

44. The module of claim 41 wherein the first level and the access surface are on different faces of the module; and wherein each non-spare chip is provided with a pair of spaced apart associated pads, a first pad of the pad pair being conductively connected to circuitry of the chip, and a second pad of the pad pair being conductively connected to a landing normally associated with the first pad of the pad pair; and wherein said conductive connecting means connects a second pad of a pad pair of the defective chip to a first pad of a corresponding pad pair of a non-defective chip.

45. The module of claim 41 further comprising an end cap laminated to an end of said plurality of stacked laminated layers, an end face of said end cap comprising the access surface of the module.

46. The module of claim 45 wherein said end cap comprises an active semiconductor layer.

47. The module of claim 45 wherein said end cap comprises a material having a coefficient of expansion substantially corresponding to a coefficient of expansion of a substrate to be bonded to the pattern of landings on the access surface of the module.

48. The module of claim 45 further comprising a redundant set of chip connection pads for providing electrical connection to chips of the module.

49. A multichip module for a high density electronic package comprising:

a plurality of laminated semiconductor chips;

an end cap laminated to an end of said plurality of laminated chips, said end cap including an active semiconductor layer and an access surface;

a plurality of integrated circuit devices formed in said active semiconductor layer, at least one of said devices comprising a spare device;

a plurality of landings on the access surface, each landing being normally associated with a respective non-spare device; and spare routing means formed on said module itself, said spare routing means being between said active semiconductor layer and said access surface for conductively connecting a landing to the spare device when a non-spare device is found to be defective.

50. A multichip module for a high density electronic package comprising:

a plurality of laminated semiconductor chips;

an end cap laminated to an end of the plurality of laminated chips;

a first array of chip connection pads on said end cap, the pads of said first array being conductively connected to individual chips of said module;

a second array of chip connection pads on said end cap, the pads of said second array being conductively connected to the same individual chips of the module as the pads of the first array such that the second array provides redundant chip connections; and means for selectively conductively connecting pads of said first and second arrays to landings on an access surface of the end cap.

51. The module of claim 50 wherein the pads of said first array are conductively connected to individual chips along a first side surface of the module and wherein the pads of the second array are conductively connected to the individual chips along a second side surface of the module.

52. A multichip module for a high density electronic package comprising:

a plurality of laminated semiconductor chips;

an end cap laminated to an end of said plurality of laminated chips, said end cap including an active semiconductor layer having an integrated circuit device formed therein; and electrical connection means for connecting a chip of said module to external circuitry through said integrated circuit device.

53. The module of claim 52 wherein said integrated circuit device comprises means for processing one of an input signal and an output signal of a chip.

54. The module of claim 53 wherein the signal processing means comprises one of: an output driver, an input receiver, and error correction code circuitry.

55. The module of claim 53 further comprising:
a plurality of chip connection landings on an access surface of said module, said chip connection landings being conductively connected to chips of said module;
a device connection landing on the access surface of the module, said device connecting landing being conductively connected to said integrated circuit device; and
means for conductively connecting the device connecting landing to a chip connecting landing.

* * * * *

UNITED STATES PATENT AND TRADEMARK OFFICE
CERTIFICATE OF CORRECTION

PATENT NO. : 5,414,637
DATED : May 9, 1995
INVENTOR(S) : Bertin, et al.

It is certified that error appears in the above-indentified patent and that said Letters Patent is hereby corrected as shown below:

Column 7, line 41, insert -- Percent of good modules= -- before the equation.

Column 20, line 1, insert -- Percent of good modules= -- before the equation.

Column 20, line 49, insert --chip-- between "set of" and "circuitry".

Signed and Sealed this

Eighteenth Day of July, 1995

Attest:

BRUCE LEHMAN

Attesting Officer

Commissioner of Patents and Trademarks